(12) United States Patent
Clark et al.

(10) Patent No.: US 11,302,588 B2
(45) Date of Patent: *Apr. 12, 2022

(54) PLATFORM AND METHOD OF OPERATING FOR INTEGRATED END-TO-END AREA-SELECTIVE DEPOSITION PROCESS

(71) Applicant: Tokyo Electron Limited, Tokyo (JP)

(72) Inventors: Robert Clark, Albany, NY (US); Kandabara Tapily, Albany, NY (US); Jason Mehigan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 83 days.

This patent is subject to a terminal disclaimer.

(21) Appl. No.: 16/356,388

(22) Filed: Mar. 18, 2019

(65) Prior Publication Data

US 2019/0295845 A1 Sep. 26, 2019

Related U.S. Application Data

(60) Provisional application No. 62/788,195, filed on Jan. 4, 2019, provisional application No. 62/787,607, filed (Continued)

(51) Int. Cl.
| | |
|---|---|
| H01L 21/66 | (2006.01) |
| H01L 21/02 | (2006.01) |
| H01L 21/285 | (2006.01) |
| H01L 21/311 | (2006.01) |
| H01L 21/67 | (2006.01) |

(Continued)

(52) U.S. Cl.
CPC .......... *H01L 22/12* (2013.01); *H01L 21/0226* (2013.01); *H01L 21/0228* (2013.01); (Continued)

(58) Field of Classification Search
CPC ......... H01L 21/67703; H01L 21/67184; H01L 21/67745; H01L 21/67063
See application file for complete search history.

(56) References Cited

U.S. PATENT DOCUMENTS 8,043,432 B2 10/2011 Dip
2004/0126482 A1 7/2004 Wu et al.
(Continued)

OTHER PUBLICATIONS

International Search Report and Written Opinion dated Jun. 26, 2019 in PCT/US2019/027711 citing documents AA, AB, AE, AF, AH therein, 16 pages.

*Primary Examiner* — Marcos D. Pizarro
*Assistant Examiner* — Antonio B Crite
(74) *Attorney, Agent, or Firm* — Oblon, McClelland, Maier & Neustadt, L.L.P.

(57) ABSTRACT

A method is provided for area-selective deposition on a semiconductor workpiece using an integrated sequence of processing steps executed on a common manufacturing platform hosting one or more film-forming modules, one or more etching modules, and one or more transfer modules. A workpiece having a target surface of a first material and a non-target surface of a second material different than the first material is received into the common manufacturing platform. An additive material is deposited on the workpiece with selectivity that results in the additive material forming on the target surface at a higher deposition rate than on the non-target surface, followed by etching to expose the non-target surface. The integrated sequence of processing steps is executed within the common manufacturing platform without leaving the controlled environment and the transfer modules are used to transfer the workpiece between the processing modules while maintaining the workpiece within the controlled environment.

20 Claims, 8 Drawing Sheets

Related U.S. Application Data on Jan. 2, 2019, provisional application No. 62/787,608, filed on Jan. 2, 2019, provisional application No. 62/784,155, filed on Dec. 21, 2018, provisional application No. 62/645,685, filed on Mar. 20, 2018.

(51) Int. Cl.

| | | |
|---|---|---|
| *H01L 21/677* | (2006.01) | |
| *H01L 21/768* | (2006.01) | |
| *H01L 21/3065* | (2006.01) | |
| *H01L 21/3213* | (2006.01) | |
| *H01L 21/324* | (2006.01) | |

(52) U.S. Cl.
CPC .. *H01L 21/02636* (2013.01); *H01L 21/28562* (2013.01); *H01L 21/31111* (2013.01); *H01L 21/32133* (2013.01); *H01L 21/67063* (2013.01); *H01L 21/67253* (2013.01); *H01L 21/67703* (2013.01); *H01L 21/67167* (2013.01)

(56) References Cited

U.S. PATENT DOCUMENTS

| | | |
|---|---|---|
| 2005/0087873 A1 | 4/2005 | Wu et al. |
| 2008/0193643 A1 | 8/2008 | Dip |
| 2008/0199504 A1 | 8/2008 | Hossainy et al. |
| 2017/0037513 A1 | 2/2017 | Haukka et al. |
| 2017/0092533 A1 | 3/2017 | Chakraborty et al. |
| 2018/0012752 A1 | 1/2018 | Tapily |
| 2019/0127873 A1* | 5/2019 | Dinneen ................ C25D 21/12 |
| 2019/0271094 A1* | 9/2019 | Brogan ................... C25D 5/04 |
| 2019/0295903 A1* | 9/2019 | Clark ................ H01L 21/28562 |

* cited by examiner

PLATFORM AND METHOD OF OPERATING FOR INTEGRATED END-TO-END AREA-SELECTIVE DEPOSITION PROCESS

CROSS-REFERENCE TO RELATED APPLICATIONS

The present application claims the benefit of U.S. Provisional Application No. 62/645,685, filed on Mar. 20, 2018, entitled "Substrate Processing Tool with Integrated Metrology and Method of Using," U.S. Provisional Application No. 62/784,155, filed on Dec. 21, 2018 entitled "Platform and Method for Operating for Integrated End-to-End Area Selective Deposition Process," U.S. Provisional Application No. 62/787,607, filed on Jan. 2, 2019, entitled "Self-Aware and Correcting Heterogeneous Platform incorporating Integrated Semiconductor Processing Modules and Method for using same," U.S. Provisional Application No. 62/787,608, filed on Jan. 2, 2019, entitled "Self-Aware and Correcting Heterogeneous Platform incorporating Integrated Semiconductor Processing Modules and Method for using same," and U.S. Provisional Application No. 62/788,195, filed on Jan. 4, 2019, entitled "Substrate Processing Tool with Integrated Metrology and Method of using," which is incorporated herein by reference in its entirety.

BACKGROUND OF THE INVENTION

Field of the Invention

The present invention relates to a processing platform and methods for semiconductor processing using the platform, and more particularly to a method for area-selective deposition (ASD).

Background of the Invention

Dimension shrinkage is one of the driving forces in the development of integrated circuit processing. By reducing the size dimensions, cost-benefit and device performance boosts can be obtained. This scalability creates inevitable complexity in process flow, especially on patterning techniques. For example, as smaller circuits such as transistors are manufactured, the critical dimension (CD) or resolution of patterned features is becoming more challenging to produce, particularly in high volume. Self-aligned patterning needs to replace overlay-driven patterning so that cost-effective scaling can continue even after the introduction of extreme ultraviolet (EUV) lithography. Patterning options that enable reduced variability, extend scaling, and enhance CD and process control are needed in a high-volume manufacturing environment; however, it is getting extremely difficult to produce scaled devices at reasonably low cost and high yield. Selective deposition, together with selective etch, can significantly reduce the cost associated with advanced patterning. Selective deposition of thin films such as gap fill, area selective deposition of dielectrics and metals on specific substrates, and selective hard masks are key steps in patterning in highly scaled technology nodes.

As devices are scaled to smaller and smaller features and techniques are implemented to try and address the issues that result from scaling, it is important to monitor the fabrication process at various stages of the process flow to determine whether the feature attributes are within specification, and if not, to adjust the process to either bring the workpiece within specification or to bring subsequently processed workpieces within specification.

In conventional device fabrication, the process steps are performed using multiple separate stand-alone tools for high-volume manufacturing. Wafers are sequentially loaded into one tool, subjected to one process step in that tool, then removed to ambient environment and placed in queue to be loaded into the next tool, and so on until the multiple steps of a given process flow are complete. Time spent waiting in queue for each tool is referred to as Q-time, and high Q-times result in lower production rates. Different operations in the process flow may take different amounts of time such that throughput matching of tools is a production challenge.

Each tool in the process flow may be part of a tool cluster. For example, five identical etch tools can be clustered in combination with a transfer tool so that 5 wafers can be etched concurrently at one step of the process flow to enable high-volume production. The multiplicity of these cluster tools provides a benefit if a tool goes out of service for any reason. If 1 tool in a 5-tool cluster goes out of service for 1 week, then production can continue, albeit at only 80% capacity. Thus, each stand-alone tool in the process flow may be a cluster of identical tools to prevent an out of service tool from shutting down production completely, and clustering may be used to minimize throughput matching challenges.

In conventional processing, if measurements are needed to determine whether a process is operating within specification, a stand-alone metrology tool may be included, where a workpiece is periodically removed from the process flow for measurements to be taken, which are often destructive measurements using a measurement pad on the workpiece, and the results can be fed back to the process flow tools for adjustments to downstream steps in the process flow, or adjustments to upstream steps for future wafers. This process involves exposure to the ambient environment, Q-time waiting for the metrology tool to be available, and lengthy measurement times for results to be obtained, such that significant time may pass before data is available to enable adjustments to be made to the process flow in either a feed-back or feed-forward manner. While real-time measurements of workpiece attributes taken in the process chamber would be ideal, exposure of the measurement devices to process gases is problematic, making real-time, in situ measurement and control logistically difficult or impossible.

Thus, the conventional approach of using multiple separate stand-alone tools (single or clustered) for high-volume manufacturing can lead to issues including but not limited to Q-time oxidation (i.e., as the wafers sit between tools waiting for their turn in the next tool, they can be subjected to oxidation from the ambient environment), defectivity from environmental exposure between tools, cost challenges due to throughput matching difficulties, temporal tool drift (e.g., EPE), real time chamber matching (e.g., yield and EPE), and lack of real-time workpiece measurement and process control. There is a need to address these and other issues to enable high-volume manufacturing with area-selective deposition (ASD) techniques.

SUMMARY OF THE INVENTION

According to embodiments, a method of selective deposition on a semiconductor workpiece is provided using an integrated sequence of processing steps executed on a common manufacturing platform hosting a plurality of processing modules including one or more film-forming modules, one or more etching modules, and one or more transfer modules. In one embodiment, the integrated sequence of processing steps includes receiving a workpiece into the common manufacturing platform, the workpiece having at least one target surface of a first material and at least one non-target surface of a second material different than the first material, and depositing an additive material on the workpiece in one of the one or more film-forming modules. The depositing is with selectivity relative to the non-target surfaces that results in a layer of the additive material forming on the target surfaces at a higher deposition rate than on the non-target surfaces. The integrated sequence of processing steps further includes etching the workpiece in one or more etching modules to remove undesired additive material from the non-target surfaces, and repeating the depositing and etching until the layer of additive material formed on the target surfaces reaches a target thickness. The integrated sequence of processing steps is executed in a controlled environment within the common manufacturing platform and without leaving the controlled environment, and the one or more transfer modules are used to transfer the workpiece between the plurality of processing modules while maintaining the workpiece within the controlled environment.

In a related embodiment, the integrated sequence of processing steps may further comprise pre-treating the workpiece before depositing the layer of additive material, or during subsequent deposition steps, to alter a surface termination of a target surface, or a surface termination of a non-target surface, or a combination thereof, with the plurality of processing modules hosted on the common manufacturing platform including one or more pre-treatment modules for performing the pre-treating in the controlled environment.

In one embodiment, the integrated sequence of processing steps includes receiving a workpiece into the common manufacturing platform, the workpiece having a target surface of a first material and a non-target surface of a second material different than the first material, and depositing an additive material on the workpiece in one or more film-forming modules. The depositing is with selectivity relative to the non-target surfaces that results in a layer of the additive material forming on the target surfaces at a higher deposition rate than on the non-target surfaces. The integrated sequence of processing steps further includes etching the workpiece in one of the one or more etching modules to remove undesired additive material from the non-target surfaces, and inspecting the additive material on the target surfaces and/or the non-target surfaces to determine defectivity, thickness, uniformity, and/or selectivity of the additive material on the workpiece. When the inspecting indicates a defectivity, surface termination, uniformity, and/or selectivity of the additive material or a target or non-target material does not meet a target threshold, a corrective action is performed on the workpiece by (i) etching the target surface, (ii) etching the non-target surface, (iii) depositing further additive material on the workpiece, (iv) thermally treating the workpiece, (v) plasma treating the workpiece, (vi) etching the additive material, (vii) performing a surface treatment to alter the surface termination of a target surface or a non-target surface, or any combination of two or more thereof. The depositing, etching, and inspecting of the workpiece are repeated when a thickness of the layer of additive material on the target surface is less than a target thickness. The integrated sequence of processing steps is executed in a controlled environment within the common manufacturing platform and without leaving the controlled environment, and the one or more transfer modules are used to transfer the workpiece between the plurality of processing modules while maintaining the workpiece within the controlled environment.

In a related embodiment, the integrated sequence of processing steps may further comprise pre-treating the workpiece before depositing the layer of additive material to alter a surface termination of the target surface, or a surface termination of the non-target surface, or a combination thereof, with the plurality of processing modules hosted on the common manufacturing platform including one or more pre-treatment modules for performing the pre-treating in the controlled environment.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1A:
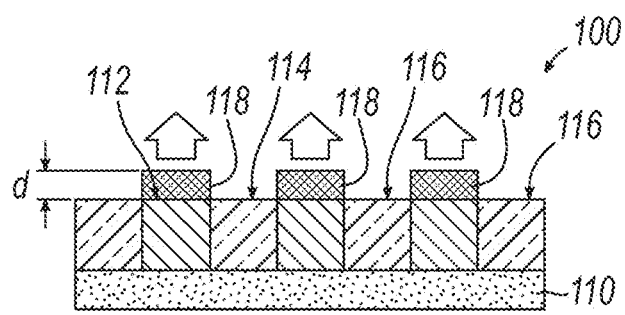
FIGS. 1A-1D are schematic cross-sectional views of methods of area-selective film formation according to embodiments of the invention.

Methods using an integrated platform for area-selective deposition (ASD) are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention but does not denote that it is present in every embodiment. Thus, the phrases such as "in one embodiment" or "in an embodiment" that may appear in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "the", "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein the term "workpiece" means a composition of materials or layers formed on a substrate during one or more phases of a semiconductor device manufacturing process, the workpiece ultimately comprising the semiconductor device at a final stage of processing.

The present embodiments include methods for ASD that utilize a common manufacturing platform in which multiple process steps are performed on the common platform within a controlled environment, for example, without breaking vacuum between operations. The integrated end-to-end platform includes both etching modules and film-forming modules and is configured to transfer a workpiece from one module to another while maintaining the workpiece in a controlled environment, e.g., without breaking vacuum or leaving an inert gas protective environment within the common manufacturing platform, and thus avoiding exposure to an ambient environment. Any ASD process may be carried out on the common manufacturing platform, and the integrated end-to-end platform will enable high-volume manufacturing at reduced cost with improvement to yield, defectivity levels and EPE.

As used herein, a "film-forming module" refers to any type of processing tool for depositing or growing a film or layer on a workpiece in a process chamber. The film-forming module may be a single wafer tool, a batch processing tool, or a semi-batch processing tool. The types of film deposition or growth that may be performed in the film-forming module include, by way of example and not limitation, chemical vapor deposition, plasma-enhanced or plasma-assisted chemical vapor deposition, atomic layer deposition, physical vapor deposition, thermal oxidation or nitridation, etc., and the process may be isotropic, anisotropic, conformal, selective, blanket, etc.

As used herein, an "etching module" refers to any type of processing tool for removing all or a portion of a film, layer, residue or contaminant on a workpiece in a process chamber. The etching module may be a single wafer tool, a batch processing tool, or a semi-batch processing tool. The types of etching that may be performed in the etching module include, by way of example and not limitation, chemical oxide removal (COR), dry (plasma) etching, reactive ion etching, wet etching using immersion or non-immersion techniques, atomic layer etching, chemical-mechanical polishing, cleaning, ashing, lithography, etc., and the process may be isotropic, anisotropic, selective, etc.

As used herein, "module" generally refers to a processing tool with all of its hardware and software collectively, including the process chamber, substrate holder and movement mechanisms, gas supply and distribution systems, pumping systems, electrical systems and controllers, etc. Such details of the modules are known in the art and therefore not discussed herein.

"Controlled environment" as used herein refers to an environment in which the ambient atmosphere is evacuated and either replaced with a purified inert gas or a low-pressure vacuum environment. A vacuum environment is well below atmospheric pressure and is generally understood to be $10^{-5}$ Torr or less, for example $5 \times 10^{-8}$ Torr or less. {Please refine definition as appropriate—to be added to all process cases}

In its broadest terms, embodiments of the disclosure relate to an integrated sequence of processing steps performed on a workpiece and executed on a common manufacturing platform hosting a plurality of processing modules including one or more film-forming modules, one or more etching modules, and one or more transfer modules. The integrated sequence of processing steps includes receiving a workpiece into the common manufacturing platform, the workpiece having a target surface of a first material and a non-target surface of a second material different than the first material. Using the one or more film-forming modules, an additive material is deposited on the workpiece with selectivity relative to the non-target surface that results in a layer of the additive material forming on the target surface at a higher deposition rate than on the non-target surface. Then, using the one or more etching modules, the workpiece is etched to expose the non-target surface. The integrated sequence of processing steps is repeated until the layer of additive material reaches a target thickness. Further, the integrated sequence of processing steps is executed in a controlled environment within the common manufacturing platform and without leaving the controlled environment, and the one or more transfer modules are used to transfer the workpiece between the plurality of processing modules while maintaining the workpiece within the controlled environment.

Embodiments may include one of the first and second materials being a metal and the other of the first and second materials being a dielectric material. The additive material may be a metal or a dielectric material. Thus, the integrated sequence of processing steps may be directed to metal-on-metal ASD, dielectric-on-dielectric ASD, metal-on-dielectric ASD, or dielectric-on-metal ASD. The metal for any of the target surface, the non-target surface, or the additive material may include, by way of example and not limitation, Cu, Al, Ta, TaN, Ti, TiN, W, Ru, Co, Ni, or Mo. The dielectric material for any of the target surface, the non-target surface, or the additive material may include, by way of example and not limitation, Sift, a low-k dielectric material, or a high-k dielectric material. Low-k dielectric materials have a nominal dielectric constant less than the dielectric constant of $SiO_2$, which is approximately 4 (e.g., the dielectric constant for thermally grown silicon dioxide can range from 3.8 to 3.9). High-k materials have a nominal dielectric constant greater than the dielectric constant of $SiO_2$.

Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material. The low-k dielectric material can include BLACK DIAMOND® (BD) or BLACK DIAMOND® II (BDII) SiCOH material, commercially available from Applied Materials, Inc., or Coral® CVD films commercially available from Novellus Systems, Inc. Other commercially available carbon-containing materials include SILK® (e.g., SiLK-I, SiLK-J, SiLK-H, SiLK-D, and porous SiLK semiconductor dielectric resins) and CYCLOTENE® (benzocyclobutene) available from Dow Chemical, and GX-3™ and GX-3P™ semiconductor dielectric resins available from Honeywell.

Low-k dielectric materials include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

In addition, low-k materials include a silicate-based material, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics.

In one example, the dielectric material, particularly when used as the additive material, may include a metal oxide that contains $TiO_2$, $HfO_2$, $ZrO_2$, or $Al_2O_3$. Such metal oxides may, for example, be deposited by CVD, plasma-enhanced CVD PEALD), ALD or plasma-enhanced ALD (PEALD). In some examples, the metal oxide may be deposited by ALD using alternating exposures of a metal-containing precursor and an oxidizer (e.g., $H_2O$, $H_2O_2$, plasma-excited $O_2$, or $O_3$).

Embodiments of the invention address integrated substrate processing for ASD and the need for performing substrate metrology during the integrated substrate processing. During ASD, substrate metrology may be performed within the common manufacturing platform following the deposition step, for example, to measure and characterize loss of deposition selectivity and, based on substrate metrology data, perform removal of undesired film nuclei to achieve selective formation. The results from the substrate metrology step may be used to tune the film nuclei removal step based on variation in the film deposition step. Further, artificial intelligence (AI) may be used to analyze the substrate metrology results and predict future film thickness and film deposition selectivity.

Reference is now made to the drawings, where like reference numerals designate identical or corresponding parts throughout the several views.

FIGS. 1A-1D schematically depict embodiments of ASD in which an additive material is selectively deposited on a target surface of a first material with selectivity relative to a non-target surface of a second material different than the first material such that a layer of the additive material forms on the target surface at a higher deposition rate than on the non-target surface. In FIG. 1A, metal-on-metal (MoM) selective deposition is shown on a planar surface of a workpiece 100. The workpiece 100 includes a substrate 110, such as a Si wafer. The workpiece further includes a target metal surface 112 and a non-target dielectric surface 114 that together form a planar surface 116. A metal additive material 118 is deposited on the target metal surface 112 to form an elevated metal pattern above the planar surface 116. The metal additive material 118 may be deposited layer by layer until a target vertical height above the planar surface 116 is reached, or a target step-height distance, d, is reached.

Figure 1B:
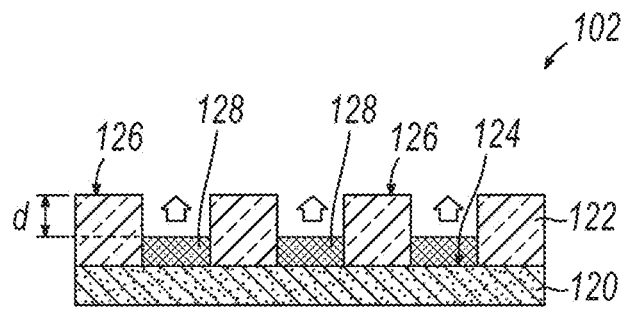

In FIG. 1B, MoM selective deposition is shown in a recessed metal feature pattern. The workpiece 102 includes a metal layer 120, which may be formed on one or more underlying layers (not shown), and a patterned interlayer dielectric 122 formed thereon to expose portions of the metal layer 120, which exposed portions form the target metal surface 124. To state another way, the target metal surface 124 is the exposed bottom surfaces of the recessed metal feature pattern formed in the interlayer dielectric 122, and the upper field or planar surface 126 of the interlayer dielectric 122 forms the non-target dielectric surface 126. A metal additive material 128 is deposited on the target metal surface 124 to at least partially fill the recessed metal feature pattern. The metal additive material 128 may be deposited layer by layer until a target fill level at or below the upper planar surface 126 is reached, or a target change in the step-height distance, d, is reached.

Figure 1C:
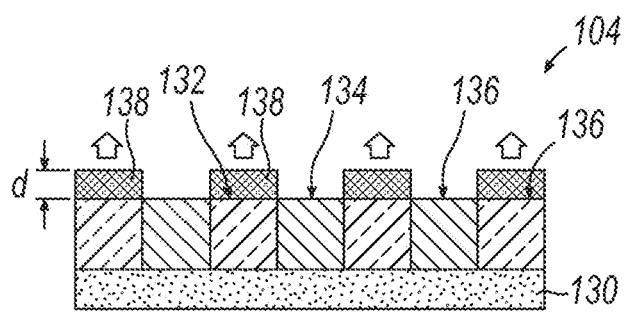

In FIG. 1C, dielectric-on-dielectric (DoD) selective deposition is shown on a planar surface. The workpiece 104 includes a substrate 130, such as a Si wafer. The workpiece further includes a target dielectric surface 132 and a non-target metal surface 134 that together form a planar surface 136. A dielectric additive material 138 is deposited on the target dielectric surface 132 to form an elevated dielectric pattern above the planar surface 136. The dielectric additive material 138 may be deposited layer by layer until a target vertical height above the planar surface 136 is reached, or a target step-height distance, d, is reached.

Figure 1D:
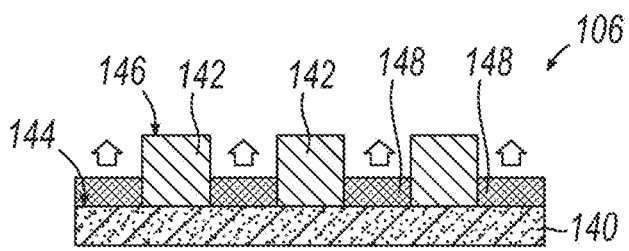

In FIG. 1D, DoD selective deposition is shown in a dielectric trench pattern. The workpiece 106 includes a dielectric layer 140, which may be formed on one or more underlying layers (not shown), and a plurality of metal lines 142 formed thereon to expose portions of the dielectric layer 140, which exposed portions form the target dielectric surface 144. To state another way, the target dielectric surface 144 is the exposed bottom surfaces of the dielectric trench pattern formed between the metal lines 142, and the upper planar surface 146 of the metal lines 142 forms the non-target metal surface 146. A dielectric additive material 148 is deposited on the target dielectric surface 144 to at least partially fill the dielectric trench pattern. The dielectric additive material 148 may be deposited layer by layer until a target fill level at or below the upper planar surface 146 is reached, or a target change in the step-height distance, d, is reached.

As stated previously, the additive material is deposited on the target surface with a selectivity relative to the non-target surface such that a layer of the additive material forms on the target surface at a higher deposition rate than on the non-target surface. Ideally, the selectivity is high enough that a target thickness of additive material is reached on the target surface before any deposition occurs on the non-target surface, i.e., the deposition rate on the target surface is relatively fast and the deposition rate on the non-target surface is extremely slow. In practice, however, some deposition may occur on the non-target surface, anywhere from a small number of nuclei as a contaminant to a complete layer of additive material. In all cases, the additive material on the non-target surface will have a thickness less than the thickness on the target surface due to the selectivity and thus higher deposition rate on the target surface. To address any deposition that occurs on the non-target surface, an etching step is performed after the selective deposition to remove additive material from the non-target surface so as to re-expose the non-target surface.

In an embodiment, the integrated sequence of processing steps further comprises a pre-treatment of the workpiece before depositing the layer of additive material. The pre-treatment is performed to alter one or both of the target and non-target surfaces. The pre-treatment may clean a surface, de-oxidize a surface, oxidize a surface, form a barrier layer on a surface, or alter a surface termination on a surface, or any combination thereof, and may include a single pre-treatment step or multiple pre-treatment steps. The common manufacturing platform may include one or more pre-treatment modules for performing the pre-treatment(s) in the controlled environment. The pre-treatment module(s) may be a film-forming module, an etching module, or other gas or plasma treatment module. In one example, a pre-treatment module is included in the common manufacturing platform for depositing or forming a barrier or blocking layer to inhibit deposition of the additive material on the non-target surface and to provide increased selectivity toward the target surface relative to the non-target surface. For example, the pre-treatment may increase the selectivity to a value of at least 10:1, or at least 100:1. In an embodiment, the workpiece is treated to add surface termination groups. The non-target surface may be treated to add termination groups that are less reactive with the additive material to thereby inhibit deposition thereon, or the target surface may be treated to add termination groups that are more reactive with the additive material to thereby promote deposition thereon. For example, hydrophobic termination groups may be added to a non-target oxide surface to inhibit deposition of metal on the oxide. In another example, a target metal surface is de-oxidized to promote deposition of metal on the oxide-free metal surface.

In an embodiment, the integrated sequence of processing steps comprises a pre-treatment of the workpiece to form a self-assembled monolayer (SAM) on the non-target surface. The SAM may be formed by exposing the workpiece to a reactant gas that contains a molecule that is capable of forming a SAM on the surface. The SAM is a molecular assembly that is formed spontaneously on substrate surfaces by adsorption and organized into more or less large ordered domains. The SAM can include a molecule that possesses a head group, a tail group, and a functional end group, and the SAM is created by the chemisorption of head groups onto the surface from the vapor phase at room temperature or above room temperature, followed by a slow organization of the tail groups. Initially, at small molecular density on the surface, adsorbate molecules form either a disordered mass of molecules or form an ordered two-dimensional "lying down phase," and at higher molecular coverage, over a period of minutes to hours, begin to form three-dimensional ordered or semi-ordered structures on the surface. The head groups assemble together at reactive sites on the surface, while the tail groups assemble normal to the surface.

According to one embodiment, the head group of the molecule forming the SAM can include a thiol, a silane, an amine, a phosphonic acid or a phosphonate. Examples of silanes include molecules that include C, H, Cl, F, and Si atoms, or C, H, Cl, and Si atoms. Non-limiting examples of the molecule include perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl(chloro)dimethylsilane (($CH_3)_3CSi(CH_3)_2Cl$)).

The presence of the SAM on the non-target surface may be used to enable subsequent selective deposition on the target surface (e.g., a dielectric layer) relative to the non-target surface (e.g., a metal layer). This selective deposition behavior provides a method for selectively depositing a film on the target surface while preventing or reducing deposition on the non-target surface.

According to a further embodiment, where a pre-treatment step is performed on the non-target surface, the etching step may remove the pre-treatment layer in addition to any additive material that deposits on the non-target surface, in one or more etching steps. Also, where the deposition and etching steps are repeated to build up the additive material on the target surface layer-by-layer, the pre-treatment may likewise be repeated before each deposition step, or less frequently as desired or needed, such as every $5^{th}$ or $10^{th}$ repetition, or it may not need to be repeated, for example, repeating de-oxidation may not be needed if the workpiece is maintained in the controlled environment and not exposed to an oxidizing environment. Removal and subsequent repeated deposition of the SAM may be desired if the SAM becomes damaged during deposition of the additive material and/or during the etching process and therefore negatively affects deposition selectivity.

FIGS. 2A-2D illustrate one embodiment of an area-selective deposition (ASD) method for a workpiece. FIG. 3 is a flow chart of a process flow 300 corresponding to the method of FIGS. 2A-2D. FIG. 4 illustrates an embodiment of a common manufacturing platform of the invention that may be used for performing process flow 300. The process flow 300 of FIG. 3 and the common manufacturing platform 400 of FIG. 4 will be referenced throughout the following sequential discussion of FIGS. 2A-2D in which a workpiece 200 is described as it proceeds through an integrated sequence of processing steps.

Figure 2A:
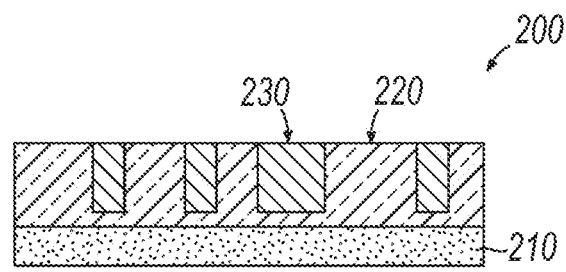
FIGS. 2A-2D illustrate in schematic cross-sectional view an integrated sequence of processing steps according to one embodiment of an area-selective deposition method.

In operation 302 of process flow 300 and as shown in FIG. 2A, workpiece 200 is provided into the common manufacturing platform 400. The workpiece 200 may include any number of material layers formed on a substrate 210, but at a minimum, the workpiece 200 includes a target surface 220 of a first material and a non-target surface 230 of a second material different than the first material. The target and non-target surfaces 220, 230 may form a planar surface, as shown, similar to FIGS. 1A and 1C, or may have an initial step-height difference, similar to FIGS. 1B and 1D. The workpiece 200 may thus have any pattern formed thereon comprising at least first and second dissimilar materials with at least one target surface 220 of the first material exposed upon which deposition is desired, and at least one non-target surface 230 of the second material exposed upon which deposition is not desired. In the embodiment depicted in FIGS. 2A-2D, the first material is a dielectric material, for example an oxide, such that the target surface 220 is a target dielectric surface, and the second material is a metal such that the non-target surface 230 is a non-target metal surface. The additive material to be deposited on the target dielectric surface 220 may be the same or different dielectric material as the first material or may be a metal.

As shown in FIG. 4, a transfer module 410a may be used to bring the workpiece into the controlled environment of the common manufacturing platform 400, which controlled environment is maintained throughout the process flow 300. The controlled environment may include a vacuum environment, where each operation in the process flow 300 is conducted without breaking vacuum, or an inert gas atmosphere, or a combination thereof. A single transfer module may be coupled between each processing module or tool, or separate transfer modules 410 may be used for each tool transfer, as depicted in FIG. 4. Transfer modules 410a-e may be collectively referred to herein as transfer modules 410 where appropriate. Where different processing modules on the common manufacturing platform 400 require different controlled environments, such as different vacuum pressures or vacuum in one module followed by a module with inert gas atmosphere, multiple transfer modules 410 may be used where the transfer modules 410 assist in implementing the transitions between the different controlled environments. While a single transfer module may be useful in a cluster-type tool where same-type processing modules are positioned in a circle around the transfer module, multiple transfer modules 410 may be more appropriate in an end-to-end platform configuration with different processing module types such as that depicted in FIG. 4. However, the embodiments herein do not preclude an end-to-end platform configuration that utilizes a single transfer module that is coupled to each of the processing modules, or some configuration in between, for example, a common transfer module for adjacent same-type processing modules that are used in sequence.

As is well known in high volume manufacturing, a front-end module 402a may be used to load a cassette of workpieces (not shown), sequentially line up the workpieces and insert them into a load lock, then into a transfer module 410a in a controlled environment, and the transfer module 410a sequentially loads the workpieces into a processing module. In the common manufacturing platform 400 of an embodiment of the invention, in operation 302, the workpiece 200, which has been received into the controlled environment, is loaded by the transfer module 410a into a first pre-treatment module 415 hosted on the common manufacturing platform 400.

Referring to FIGS. 3 and 4, in optional operation 304, in the first pre-treatment module 415, a first pre-treatment process is performed to expose the workpiece 200 to a treatment gas. For example, the treatment gas can include an oxidizing gas or a reducing gas. In some examples, the oxidizing gas can include $O_3$, $O_2$, $H_2O$, $H_2O_2$, isopropyl alcohol, or a combination thereof, and the reducing gas can include silane, disilane, trisilane, trimethylaluminum, $NH_3$, $BH_3$, $PH_3$, $H_2$ gas. In one example, the treatment gas can include or consist of a plasma-excited. The plasma excited gas may for example be an oxidizing gas, a reducing gas, or a reducing gas. In another example, the a bias may be applied to the substrate, to a portion or part of the treatment module, or a combination thereof during the exposing to the treatment gas. The treatment gas can clean or alter the surface of either the target dielectric surface 220 or the non-target metal surface 230 to improve subsequent ASD. The treatment gas can form a blocking layer on the non-target surface by reacting with surface groups on the non-target surface. In another example the treatment gas can form a nucleation layer on the target surface. In another example the treatment gas can form a self-assembled monolayer (SAM) on a target surface or on a non-target surface.

Figure 2B:
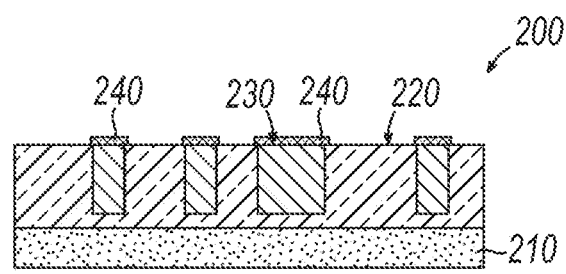
Figure 3:
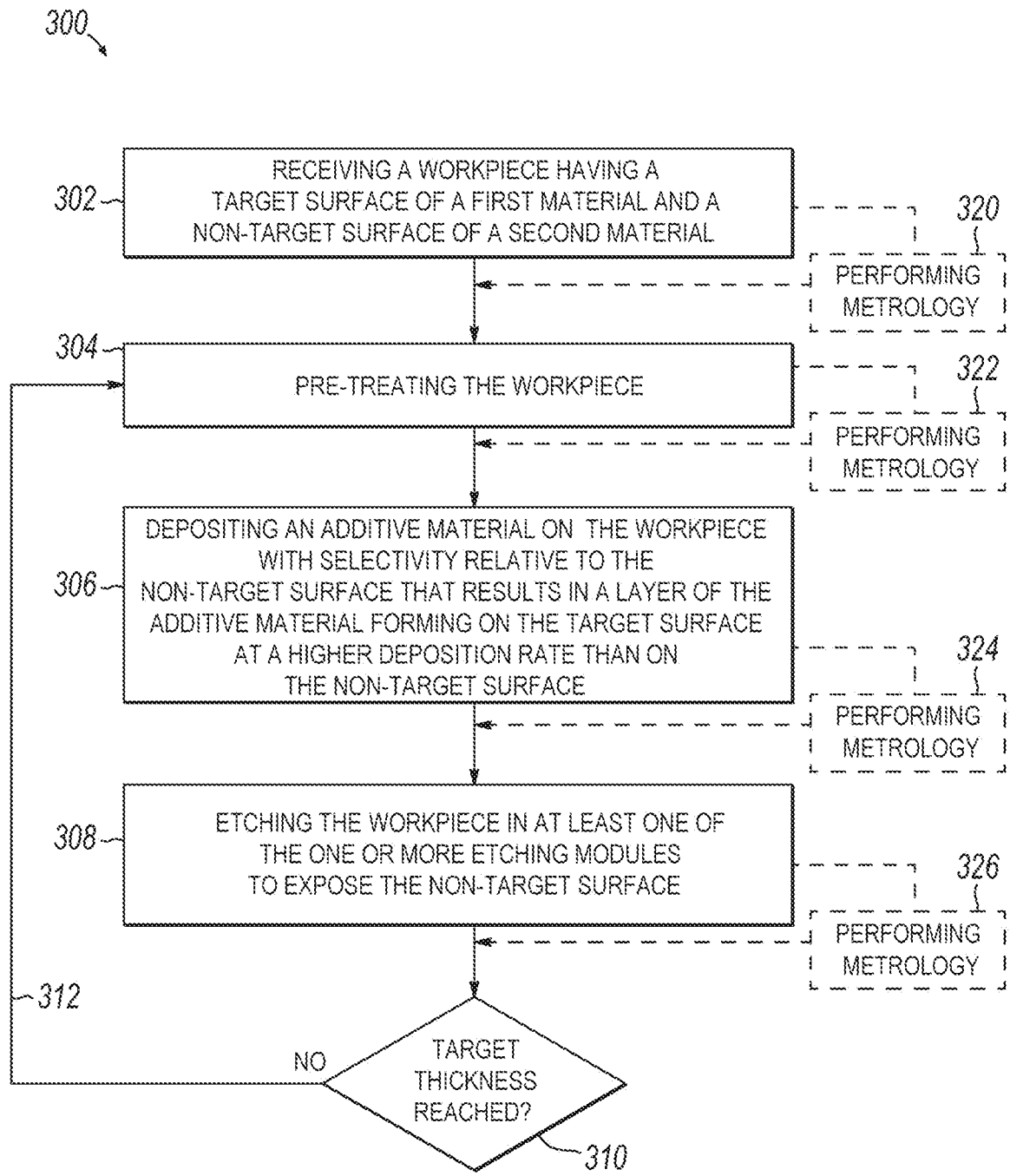
FIG. 3 is a flow chart diagram illustrating one embodiment of an integrated process flow for area-selective deposition.
Figure 4:
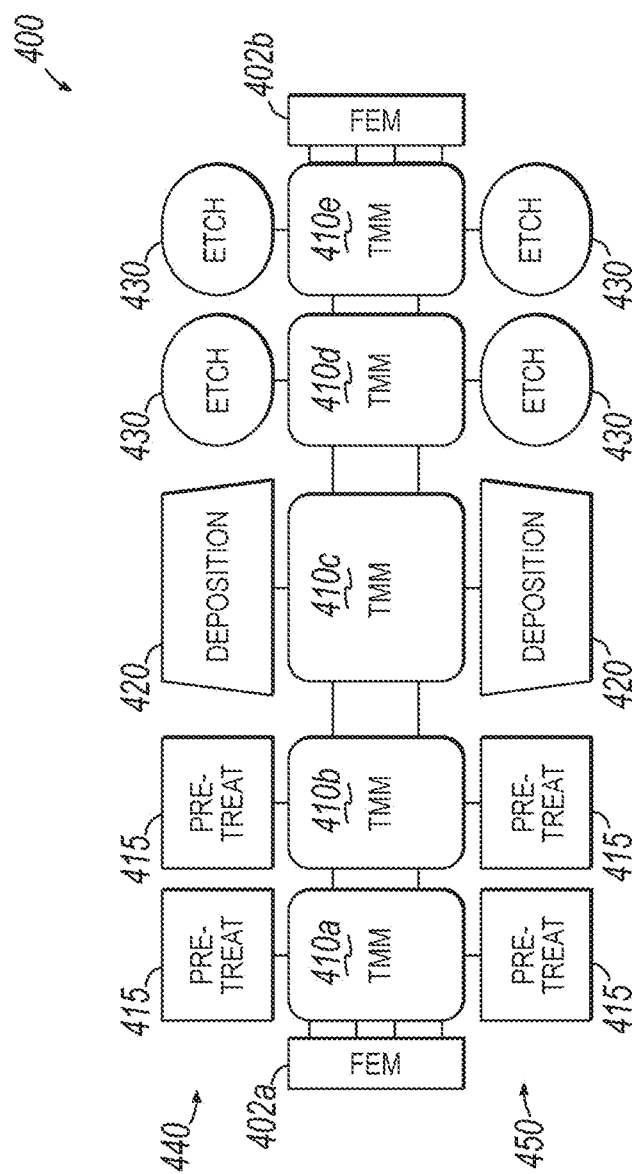
FIG. 4 is a schematic diagram illustrating one embodiment of a common manufacturing platform for performing an integrated area-selective deposition method.

Referring to FIGS. 2B, 3 and 4, and further in optional operation 304, without leaving the controlled environment, e.g., without breaking vacuum, transfer modules 410a and 410b are used to transfer the workpiece 200 to a second pre-treatment module 415. In the second pre-treatment module 415, a second pre-treatment process is performed to render the non-target metal surface 230 less attractive or reactive to the additive material to be deposited on the target dielectric surface 220. As shown, the pre-treatment may include a barrier layer 240 being selectively deposited over the non-target metal surface 230 to inhibit deposition of the additive material thereon and to increase the selectivity toward the target dielectric surface 220. The barrier layer 240 may be a SAM or any other surface treatment layer that has the effect of inhibiting deposition of the additive material on the treated surface. While barrier layer 240 may be referred to as SAM 240 in the following discussion, it may be appreciated that the invention is not limited solely to a SAM as a barrier layer. The SAM 240 may be deposited on the exposed non-target metal surface 230, as shown, or may convert a surface portion of the exposed non-target metal surface 230 to a barrier layer, or a combination thereof. As shown, the common manufacturing platform 400 may include identical pre-treatment modules 415 on opposing sides of the transfer modules 410a, 410b. By mirroring the two sides of the platform 400, end-to-end processing can be achieved for two workpieces concurrently, and if one pre-treatment module 415 goes out of service temporarily, the platform 400 can continue to operate, at least at 50% capacity.

Figure 2C:
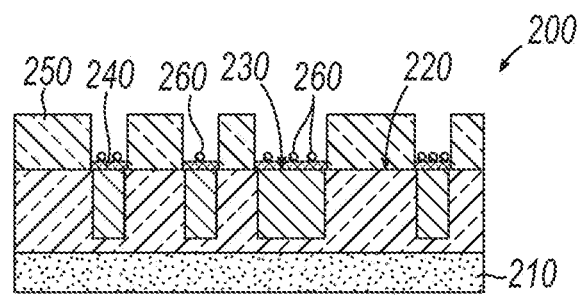

Then, without leaving the controlled environment, e.g., without breaking vacuum, transfer modules 410b and 410c are used to transfer the workpiece 200 to a film-forming module 420. Referring to FIGS. 2C and 3, in operation 306, in the film-forming module 420, dielectric additive material 250 is selectively deposited on the target dielectric surface 132 to form an elevated dielectric pattern. Due to the selectivity toward the target surface 220 relative to the SAM 240 on the non-target surface 230, a layer of the dielectric additive material 250 forms on the target dielectric surface 220 at a higher deposition rate than on the non-target surface 230. In one example, the dielectric additive material 250 may include a metal oxide film that contains $HfO_2$, $ZrO_2$, or $Al_2O_3$. The dielectric additive material 250 may, for example, be deposited by CVD, plasma-enhanced CVD PEALD), ALD or plasma-enhanced ALD (PEALD). In some examples, the dielectric additive material 250 may be deposited by ALD using alternating exposures of a metal-containing precursor and an oxidizer (e.g., $H_2O$, $H_2O_2$, plasma-excited $O_2$, or $O_3$). Again, the common manufacturing platform 400 may include two identical film-forming modules 420 on opposing sides of the transfer module 410c.

As depicted in FIG. 2C, the exposure to deposition gases in film-forming module 420 may, in addition to depositing the dielectric additive material 250 on the target dielectric surface 220, deposit film nuclei 260 on the SAM 240 as a result of a loss of selectivity or insufficient selectivity. Loss of deposition selectivity can occur, for example, if the deposition process is carried out for too long. Insufficient or poor deposition selectivity can occur, for example, if surface coverage of the SAM 208 is incomplete and contains voids on the non-target surface 230.

Figure 2D:
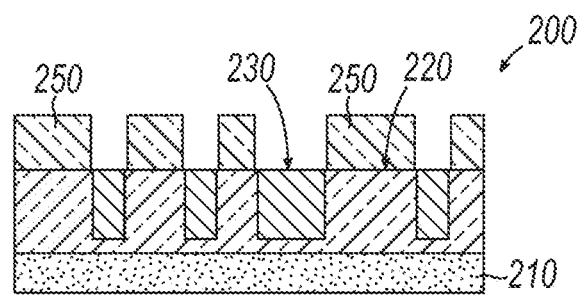

Referring to FIGS. 2D and 3, in operation 308, and without leaving the controlled environment, e.g., without breaking vacuum, the workpiece 200 is transferred to one or more etching modules to perform one or more etching steps to expose the non-target surface 230 and thereby achieve the ASD on the target surface 220. In this example, and as shown in FIG. 4, two etching steps are performed sequentially in first and second etching modules 430, to first remove the film nuclei 260 and then remove the SAM 240. Transfer modules 410c and 410d are used to transfer the workpiece 200 to a first etching module 430 hosted on the common manufacturing platform 400, e.g., transfer module 410c removes the workpiece 200 from film-forming module 420 and transfers it to transfer module 410d, which then delivers the workpiece 200 into first etching module 430. Adjustments to the controlled environment may be made in transfer modules 410c and 410d if first etching module 430 operates with different parameters than film-forming module 420, such as different vacuum pressures. The workpiece 200 is etched in the first etching module 430a to remove the film nuclei 260 from upper surfaces of the SAM 240. Although the layer of dielectric additive material 250 may also be partially removed by the etching process, the film nuclei 260 are expected to etch faster than etching of the layer of dielectric additive material 250. The etching process can include a dry etching process, a wet etching process, or a combination thereof.

Transfer modules 410d and 410e are then used to transfer the workpiece 200 to a second etching module 430 hosted on the common manufacturing platform 400, and the workpiece 200 is etched to remove the SAM 240. Again, the common manufacturing platform 400 may include identical first etching modules 430 on opposing sides of the transfer modules 410d and 410e. Alternatively, the SAM 240 may be removed by a different method, such as by heat treatment, in a designated treatment module or in one of the processing modules used in another step of the integrated sequence of processing steps.

If a target thickness for the layer of dielectric additive material 250 has not been reached, as determined in operation 310, the above-described integrated sequence of processing steps 304-308, may be repeated, in whole or in part, one or more times to increase the thickness of the layer of dielectric additive material 250 on the workpiece 200, as schematically shown by process arrow 312. Removal and subsequent repeated deposition of the SAM 240 on the workpiece 200 may be desired if the SAM 240 becomes damaged during the additive material deposition and/or the etching process to remove the film nuclei 260. However, if the SAM 240 has not been compromised, its removal and reapplication may be omitted in the repetition of the additive material deposition and film nuclei etch.

Upon completion of process flow 300, i.e., when the determination in operation 310 indicates the target thickness has been reached, the workpiece 200 exits the common manufacturing platform 400 via another front-end module 402b, which may be identical to front-end module 402a, although located at the back end of the end-to-end arrangement of modules on common manufacturing platform 400. In the generally reverse process of front-end module 402a, the workpieces 100 are sequentially transferred by transfer module 410e to a load lock where the controlled environment is removed and then into a cassette (not shown) on the front-end module 402b. The common manufacturing platform 400 arranged in a substantially mirrored fashion has the advantage of providing redundancy in the event a module has to go out of service, where the common manufacturing platform 400 could still operate at a reduced capacity.

In one embodiment, and as will be discussed in more detail below, the common manufacturing platform 400 advantageously includes an "active interdiction system." The active interdiction system includes a workpiece measurement region within a transfer module 410 hosted on the common manufacturing platform 400 or an integrated metrology module (not shown) hosted on the common manufacturing platform 400. The workpiece measurement region may be located in a dedicated area of the transfer module 410, as described in more detail below. The workpiece measurement region or metrology module may include an inspection system for gathering measurement data. As described in more detail below, the inspection system may include at least one optical source for directing an optical beam incident on a measurement surface of the workpiece and at least one detector arranged to receive an optical signal scattered from the measurement surface of the workpiece. The active interdiction system may further include an intelligence system hosted on the common manufacturing platform 400 that is configured to gather data from the workpiece measurement region or metrology module and control the integrated sequence of processing steps executed on the common manufacturing platform 400, such as process flow 300.

For active interdiction in accordance with embodiments of the invention, the workpiece measurement region or metrology module collects real time data "on the fly" pertaining to attributes of features or layers on the semiconductor workpiece (e.g., film or feature thickness, feature depth, surface roughness, pattern shift, voids or other defects, loss of selectivity, lateral overgrowth, uniformity, etc.) and uses such real time data to concurrently control integration operating variables in the integrated processing modules hosted on the common manufacturing platform 400. The data can be used in a feed-back and/or feed-forward manner to control operations performed on the workpiece in subsequent modules and/or to control operations performed in prior modules on a subsequent workpiece, for example as will be explained below with reference to operations 320-326 of FIG. 3. In an embodiment, the common manufacturing platform 400 includes a correction module, which may be a film-forming module 420, an etching module 430, a pre-treatment module 415, or other type of treatment module as appropriate for applying corrective action or remedial treatment to the workpiece 200.

Unlike traditional metrology or process control, the workpiece does not leave the controlled environment to enter a stand-alone metrology tool thereby minimizing oxidation and defect generation, the measurements are non-destructive such that no workpiece is sacrificed to obtain data thereby maximizing production output, and the data can be collected in real time as part of the process flow to avoid negatively impacting production time and to enable in-process adjustments to the workpiece or to subsequent workpieces being sequentially processed on the common manufacturing platform 400. Additionally, the measurements are not performed in the film-forming or etching modules, thereby avoiding issues when measurement devices are exposed to process fluids. For example, by incorporating workpiece measurement regions into the transfer module, the data can be obtained as the workpiece is traveling between processing tools with little to no delay in the process flow, without exposure to process fluids, and without leaving the controlled environment, e.g., without breaking vacuum. While the "on the fly" data may not be as accurate as the data obtained from traditional destructive methods performed in stand-alone metrology tools, the nearly instantaneous feedback on the process flow and ability to make real-time adjustment without interrupting the process flow or sacrificing yield is highly beneficial for high-volume manufacturing.

With further reference to the process flow 300 of FIG. 3, the method may include inspecting the workpiece, such as performing metrology, i.e., obtaining measurement data, using the active interdiction system at any of various times throughout the integrated method, without leaving the controlled environment, e.g., without breaking vacuum. Inspection of the workpiece may include characterizing one or more attributes of the workpiece and determining whether the attribute meets a target condition. For example, the inspection may include obtaining measurement data related to an attribute and determining whether a defectivity, thickness, uniformity, and/or selectivity condition meets a target for that condition. While the following discussion will focus on obtaining measurement data, it may be understood that other inspection techniques performed within the controlled environment of the common manufacturing platform are also within the scope of the invention.

The active interdiction system may include a single metrology module or workpiece measurement region on the common manufacturing platform 400 or may include multiple metrology modules or workpiece measurement regions on the common manufacturing platform 400, as will be discussed in more detail below. Each metrology operation is optional, as indicated by the phantom lines in FIG. 3, but may be advantageously performed at one or more points in the process flow to ensure the workpiece 200 is within specification. In one embodiment, measurement data is obtained after each step of the integrated sequence of processing steps conducted on the common manufacturing platform. The measurement data may be used to repair the workpiece in a correction module prior to leaving the common manufacturing platform, and/or may be used to alter parameters of the integrated sequence of processing steps for subsequent steps and/or for subsequent workpieces.

In broad terms, within the controlled environment, measurement data may be obtained during the integrated sequence of processing steps related to the selective deposition of the additive material and, based on the measurement data, a determination may be made whether defectivity, thickness, uniformity, and/or selectivity of the layer of additive material meets a target condition. When the defectivity, thickness, uniformity, and/or selectivity is determined to not meet the target condition, or an attribute of the workpiece is otherwise determined to be non-conforming, the workpiece may be subjected to further processing. For example, the workpiece may be processed in a correction module on the common manufacturing platform to remove, minimize, or compensate for the non-conforming attribute prior to performing a next processing step in the integrated sequence of processing steps. The corrective action may include etching the target surface or non-target surface, depositing further additive material on the workpiece, repairing a barrier layer on the workpiece, thermally treating the workpiece, or plasma treating the workpiece.

In one example, the corrective action may include removing the SAM when the non-conformity is based, at least in part, on incomplete coverage of the non-target surface by the SAM or when an amount of exposed area of the non-target surface is greater than a predetermined exposed area threshold. In another example, the corrective action may include removing at least a portion of the layer of additive material when the non-conformity is based, at least in part, on a step-height distance between the target surface and the non-target surface being less than a predetermined step-height threshold or an amount of exposed area of the non-target surface being less than the predetermined exposed area threshold. In yet another example, the corrective action may include adding further additive material to the workpiece when the non-conformity is based, at least in part, on a thickness of the additive material overlying the target surface being less than a predetermined thickness threshold. In a still further example, the corrective action may include etching the workpiece when the non-conformity is based, at least in part, on a remaining additive material on the non-target surface or a remaining self-assembled monolayer on the non-target surface being greater than a predetermined remaining thickness threshold. In another example, the corrective action may include thermally treating or plasma treating the workpiece when the non-conforming workpiece attribute is based, at least in part, on a reflectivity from the workpiece being less than a predetermined reflectivity threshold.

The correction modules may be different film-forming and etching modules that are designated as correction modules on the common manufacturing platform or another type of treatment module integrated on the common manufacturing platform, such as a thermal annealing module, or may be the same film-forming and etching modules used to selectively deposit the additive material and etch the film nuclei.

The process flow 300 of FIG. 3 will now be described in detail with the optional inspection or metrology operations used to characterize attributes of the workpiece to determine when a target thickness for the ASD is reached and/or to determine if a non-conformality is present. Operation 302 includes receiving a workpiece having the target and non-target surfaces into a common manufacturing platform. Operation 320 includes optionally performing metrology to obtain measurement data related to attributes of the incoming workpiece, such as attributes of the target surface and/or the non-target surface, which measurement data may be used to adjust and/or control process parameters of any one of operations 304-308.

Operation 304 includes optionally pre-treating the workpiece. The pre-treatment may be a single operation or multiple operations executed on the common manufacturing platform. Operation 322 includes optionally performing metrology to obtain measurement data related to attributes of the workpiece following the pre-treatment. If multiple pre-treatment operations are performed, the measurement data may be obtained after all pre-treatments are completed and/or after any individual pre-treatment step. In one example, the workpiece is inspected after a SAM is formed to determine whether the coverage is complete or if an exposed area of the treated surface exceeds a threshold value. The measurement data may be used to adjust and/or control process parameters of any one of operations 306-

308, may be used to make adjustments for subsequent workpieces to the incoming attributes of the workpieces in operation 302 or to operation 304, or may be used to repair the workpiece before continued processing. In one embodiment, when the measurement data indicates that one or more attributes do not meet a target condition, the workpiece may be transferred to a correction module to repair the workpiece. For example, when coverage by a SAM on the non-target surface is incomplete, corrective action may be taken in one or more correction modules, such as removing the SAM and reapplying the SAM.

Operation 306 includes selectively depositing additive material on the workpiece in a film-forming module hosted on the common manufacturing platform. Operation 324 includes optionally performing metrology to obtain measurement data related to attributes of the workpiece having the layer of additive material formed on the target surface, such as attributes of the layer of additive material, the non-target surface, and/or a pre-treated surface as affected by the selective deposition, which measurement data may be used to adjust and/or control process parameters of any one of operations 308-312, may be used to make adjustments for subsequent workpieces to the incoming attributes of the workpieces in operation 302 or to operations 304-306, or may be used to repair the workpiece before continued processing. In one embodiment, when the measurement data indicates that one or more attributes do not meet a target condition, the workpiece may be transferred to a correction module to repair the layer of additive material or the non-target surface. For example, when the defectivity, thickness, uniformity, or selectivity of the additive material does not meet a target condition, corrective action may be taken in one or more correction modules, such as by selectively depositing additional additive material onto the target surface, removing additive material from the non-target surface or target surface, removing a pre-treatment layer from the non-target surface, thermally treating or plasma treating the workpiece, or a combination of two or more thereof.

Operation 308 includes etching the workpiece using an etching module hosted on the common manufacturing platform to expose the non-target surface. Operation 308 may include etching film nuclei that deposited on the non-target surface or on a SAM formed on the non-target surface or etching a complete layer of additive material deposited on the non-target surface or on a SAM formed on the non-target surface at a thickness less than the thickness of the layer of additive material formed on the target surface. Operation 308 may also include removing a SAM or other pre-treatment layer from the non-target surface, either in the same etching step or a subsequent etching step. Operation 326 includes optionally performing metrology to obtain measurement data related to attributes of the workpiece having the layer of additive material on the target surface and the etched non-target surface, such as attributes of the layer of additive material as affected by the etching, attributes of the non-target surface exposed by the etching, and/or attributes of a SAM or other pre-treatment layer as affected by etching the film nuclei from the SAM on the non-target surface, which measurement data may be used to adjust and/or control process parameters of any one of operations 310-312, including steps 304-308 in the repetition of the sequence per operation 312, may be used to make adjustments for subsequent workpieces to the incoming attributes of the workpieces in operation 302 or to operations 304-308, or may be used to repair the workpiece before continued processing. In one embodiment, when the measurement data indicates that one or more attributes do not meet a target condition, the workpiece may be transferred to a correction module to the layer of additive material or the non-target surface. For example, when the defectivity, thickness, uniformity, or selectivity of the additive material does not meet a target condition, corrective action may be taken in one or more correction modules, such as by selectively depositing additional additive material onto the target surface, removing additive material from the non-target surface or target surface, removing a pre-treatment layer from the non-target surface, thermally treating or plasma treating the workpiece, or a combination of two or more thereof. Further, when the measurement data indicates that the thickness of the layer of additive material is less than a target thickness, such that determination 310 is No, the workpiece may be subjected to repeating steps of the sequence per operation 312. When the measurement data indicates that the thickness of the layer of additive material has reached the target thickness, such that determination 310 is Yes, the workpiece may exit the common manufacturing platform.

Process parameters, as referred to above, may include any operating variable within a processing module, such as but not limited to: gas flow rates; compositions of etchants, deposition reactants, purge gases, etc.; chamber pressure; temperature; electrode spacing; power; etc. The intelligence system of the active interdiction system is configured to gather measurement data from the inspection system and control the integrated sequence of processing steps executed on the common manufacturing platform, for example, by making in situ adjustments to processing parameters in subsequent processing modules for the workpiece in process, or by changing process parameters in one or more processing modules for subsequent workpieces. Thus, the obtained measurement data may be used to identify a needed repair to the workpiece during the integrated sequence of processing steps to avoid having to scrap the workpiece, and/or to adjust processing parameters for the integrated sequence of processing steps for steps performed on the same workpiece after the measurement data is obtained or for processing subsequent workpieces to reduce occurrences of the target conditions not being met for the subsequent workpieces.

With further reference to FIG. 4, the common manufacturing platform 400 generally includes at least one front-end module 402, for example one at each end of the common manufacturing platform 400 as shown for transferring workpieces 100 into and out of the common manufacturing platform 400. Common manufacturing platform 400 includes a plurality of transfer modules 410 for transferring workpieces into and out of a plurality of processing modules hosted on the common manufacturing platform 400. The plurality of processing modules includes one or more film-forming modules 420, such as one or more deposition tools, and one or more etching modules 430, such as one or more dry etching tools, wet etching tools and/or COR tools. Optionally, the plurality of processing modules further includes one or more pre-treatment modules 415, which may be film-forming modules, etching modules or other type of processing module. The pre-treatment modules 415 may be used to perform operation 304. The film-forming modules 420 may be used to perform operation 306. The etching modules 430 may be used to perform operation 308. Any of the processing modules may serve as a correction module for repairing the workpiece, or additional processing modules may be added for performing corrective action. As shown, the plurality of processing modules generally forms two lines 440, 450 from front end to back end, one line 440 down one side of a row of transfer modules 410 and the other line 450 down the other side of the row of transfer modules 410.

In one example, a single workpiece 100 is processed down line 440 from front end to back end, then transferred back to the front end and processed again down line 450. Thus, the pre-treatment operation 304, selective deposition operation 306, and etch operation 308 are performed down line 440 to deposit an initial thickness of additive material, then the pre-treatment operation 304, selective deposition operation 306, and etch operation 308 are performed down line 450 to further increase the additive material thickness, thereby repeating the operations in two passes down the end-to-end common manufacturing platform 400.

In another example, the two lines 440, 450 operate independently to process two workpieces 200 concurrently, either temporally in-phase or temporally off-set, each progressing down one of the lines 440 or 450 from front end to back end, then transferred back to the front end and each processed again down the same line 440 or 450 for additional repetitions. Thus, the pre-treatment operation 304, selective deposition operation 306, and etch operation 308 are performed down each line 440 and 450 to deposit the initial thickness of additive material, then the pre-treatment operation 304, selective deposition operation 306, and etch operation 308 are repeated down the same lines 440 and 450 to further increase the additive material thickness, thereby repeating the operations in two or more passes down the end-to-end common manufacturing platform 400. This example has the advantage of providing redundancy in the event a module has to go out of service, where the common manufacturing platform 400 can still operate at 50% capacity.

A cleaning etch or repair process can be performed at the end of the first or a subsequent pass before transferring the workpiece 200 back to the front end in order to clean or repair the workpiece before repeating the operations or before exiting the common manufacturing platform 400. A correction module may be added in the lines 440, 450 for performing repairs.

In one embodiment, the common manufacturing platform includes at least one deposition module for selectively depositing additive material on a target surface, at least one etching module for removing additive material from a non-target surface to achieve selectivity, and at least one transfer module for transferring the workpiece between modules while maintaining a controlled environment throughout the integrated process flow. Advantageously, a pre-treatment module is included for forming a SAM on the non-target surface as a barrier layer to increase selectivity toward the target surface, and the at least one etching module includes at least two etching modules, one for removing additive material from the SAM and one for removing the SAM. In a further embodiment, the common manufacturing platform includes at least one workpiece measurement region, which is located within a dedicated area of the at least one transfer module or within a metrology module hosted on the common manufacturing platform within the controlled environment, for obtaining measurement data related to one or more attributes of the workpiece. In one embodiment, the common manufacturing platform includes at least one correction module for performing a repair of the workpiece, such as repairing the selectively deposited additive material or repairing a SAM.

As may be appreciated by persons having ordinary skill in the art, the number and positioning of processing modules on the common manufacturing platform as well as metrology operations may be selected based on the processing time in the different modules needed to carry out the operations in the different modules to provide essentially continuous process flow through the common manufacturing platform and thus good throughput matching.

FIGS. 5A-5D illustrate another embodiment of an area-selective deposition (ASD) method for a workpiece, which method may also be performed according to the process flow 300 of FIG. 3 executed on the common manufacturing platform 400 of FIG. 4. The workpiece 500 includes a target surface 520 of a first material and a non-target surface 530 of a second material different than the first material on substrate 510. The target and non-target surfaces 520, 530 may form a planar surface, as shown, similar to FIGS. 1A and 1C, or may have an initial step-height difference, similar to FIGS. 1B and 1D. The workpiece 500 may thus have any pattern formed thereon comprising at least first and second dissimilar materials with at least one target surface 520 of the first material exposed upon which deposition is desired, and at least one non-target surface 530 of the second material exposed upon which deposition is not desired. In the embodiment depicted in FIGS. 5A-5D, the first material is a metal such that the target surface 520 is a target metal surface, and the second material is a dielectric material such that the non-target surface 530 is a non-target dielectric surface. The additive material to be deposited on the target metal surface 520 may be the same or different metal as the first metal or may be a dielectric material.

Referring to FIGS. 3 and 4, in optional operation 304, in the first pre-treatment module 415, a first pre-treatment process is performed to expose the workpiece 200 to a treatment gas. For example, the treatment gas can include an oxidizing gas or a reducing gas. In some examples, the oxidizing gas can include $O_2$, $H_2O$, $H_2O_2$, isopropyl alcohol, or a combination thereof, and the reducing gas can include $H_2$ gas. In one example, the treatment gas can include or consist of plasma-excited Ar gas. The treatment gas can clean or alter the surface of either the target metal surface 520 or the non-target dielectric surface 530 to improve subsequent ASD. For ASD on a metal surface, a de-oxidizing treatment of the target metal surface 520 may be desired.

Figure 5A:
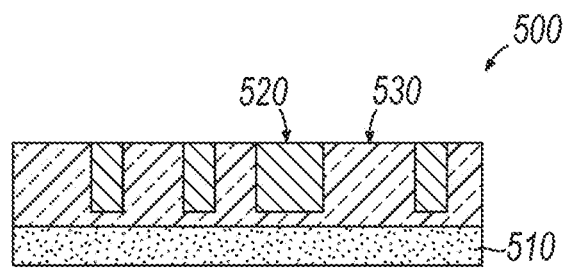
FIGS. 5A-5D illustrate in schematic cross-sectional view an integrated sequence of processing steps according to another embodiment of an area-selective deposition method.
Figure 5B:
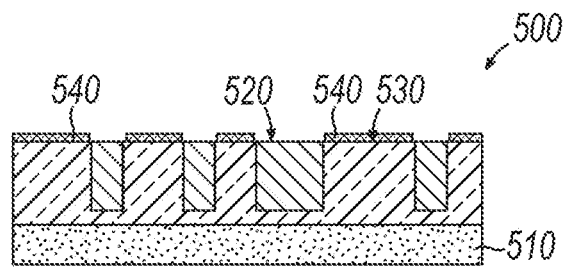

Referring to FIGS. 5B, 3 and 4, and further in optional operation 304, without leaving the controlled environment, e.g., without breaking vacuum, a second pre-treatment process is performed to render the non-target dielectric surface 530 less attractive or reactive to the additive material to be deposited on the target metal surface 520. As shown, the pre-treatment may include a barrier layer 540 being selectively deposited over the non-target dielectric surface 530 to inhibit deposition of the additive material thereon and to increase the selectivity toward the target metal surface 520. The barrier layer 540 may be a SAM or any other surface treatment layer that has the effect of inhibiting deposition of the additive material on the treated surface.

Figure 5C:
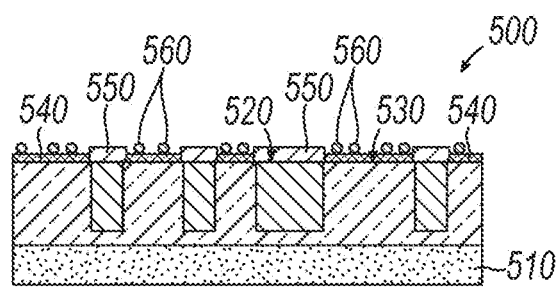

Then, without leaving the controlled environment, e.g., without breaking vacuum, and referring to FIGS. 5C and 3, in operation 306, in the film-forming module 420, metal additive material 550 is selectively deposited on the target metal surface 520 to form an elevated metal pattern. Due to the selectivity toward the target metal surface 520 relative to the SAM 540 on the non-target dielectric surface 530, a layer of the metal additive material 550 forms on the target metal surface 520 at a higher deposition rate than on the non-target dielectric surface 530.

As depicted in FIG. 5C, the exposure to deposition gases in film-forming module 420 may, in addition to depositing the metal additive material 550 on the target metal surface 520, deposit film nuclei 560 on the SAM 540 as a result of a loss of selectivity or insufficient selectivity. Loss of deposition selectivity can occur, for example, if the deposition process is carried out for too long. Insufficient or poor deposition selectivity can occur, for example, if surface coverage of the SAM 540 is incomplete and contains voids on the non-target dielectric surface 530.

Figure 5D:
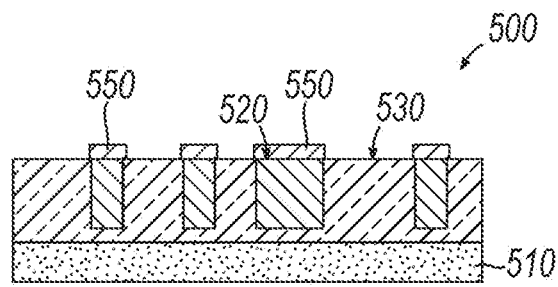

Referring to FIGS. 5D and 3, in operation 308, and without leaving the controlled environment, e.g., without breaking vacuum, the workpiece 500 is transferred to one or more etching modules to perform one or more etching steps to expose the non-target dielectric surface 530 and thereby achieve the ASD on the target metal surface 520. In this example, two etching steps are performed sequentially to first remove the film nuclei 560 and then remove the SAM 540. The workpiece 500 is etched in the first etching module 430 to remove the film nuclei 560 from upper surfaces of the SAM 540. Although the layer of metal additive material 550 may also be partially removed by the etching process, the film nuclei 560 are expected to etch faster than etching of the layer of metal additive material 550. The etching process can include a dry etching process, a wet etching process, or a combination thereof.

In a second etching module 430 hosted on the common manufacturing platform 400, the workpiece 500 is etched to remove the SAM 540. Alternatively, the SAM 540 may be removed by a different method, such as by heat treatment, in a designated treatment module or in one of the processing modules used in another step of the integrated sequence of processing steps.

If a target thickness for the layer of metal additive material 550 has not been reached, as determined in operation 310, the above-described integrated sequence of processing steps 304-308, may be repeated, in whole or in part, one or more times to increase the thickness of the layer of metal additive material 550 on the workpiece 500, as schematically shown by process arrow 312. Removal and subsequent repeated deposition of the SAM 540 on the workpiece 500 may be desired if the SAM 540 becomes damaged during the additive material deposition and/or the etching process to remove the film nuclei 560. However, if the SAM 540 has not been compromised, its removal and reapplication may be omitted in the repetition of the additive material deposition and film nuclei etch. Upon completion of process flow 300, i.e., when the determination in operation 310 indicates the target thickness has been reached, the workpiece 500 exits the common manufacturing platform 400. The same optional metrology steps 320-326 as described above may also be performed in the embodiment of FIGS. 5A-5D.

In accordance with an embodiment, within the controlled environment, measurement data may be obtained related to one or more attributes of the workpiece and, based on the measurement data, a determination may be made whether a defectivity, thickness, uniformity, and/or selectivity of the additive material on the workpiece meets a target condition. When the target condition is not met, the workpiece may be processed in a correction module to remove at least a portion of the additive material from the target surface and/or the non-target surface, or to perform other corrective action. When the measurement data indicates an attribute is non-conforming, the corrective action may remove, minimize, or compensate for the non-conforming attribute prior to performing a next processing step in the integrated sequence of processing steps.

At least one of the transfer modules may include a workpiece measurement region located within a dedicated area thereof for obtaining the measurement data, and the data may be obtained during at least one of the transfers of the workpiece between the plurality of processing modules by passing the workpiece into the workpiece measurement region. Alternatively or additionally, the common manufacturing platform may include one or more metrology modules, and the data is obtained by transferring the workpiece into the metrology module before, between or after one or more of the processing steps of the integrated sequence of processing steps.

The one or more attributes to which the obtained measurement data may relate include attributes of the target surface prior to depositing the additive material, attributes of the non-target surface prior to depositing the additive material, attributes of the layer of additive material after depositing the additive material, attributes of the non-target surface after depositing the additive material, attributes of the layer of additive material after etching the workpiece, or attributes of the non-target surface after etching the workpiece. Further, the one or more attributes may include an amount of voids on the target surface, an amount of additive material on the non-target surface, a loss of selectivity, a profile of the additive material, an amount of the additive material on one region of the workpiece relative to an amount of the additive material on another region of the workpiece, or a combination of two or more thereof.

In an embodiment, corrective action to address a non-conforming attribute may include removing the self-assembled monolayer when the non-conforming attribute is based, at least in part, on incomplete coverage of the non-target surface by the self-assembled monolayer or an amount of exposed area of the non-target surface being greater than a predetermined exposed area threshold. In another embodiment, corrective action to address a non-conforming attribute may include removing at least a portion of the layer of additive material when the non-conforming attribute is based, at least in part, on a step-height distance between the target surface and the non-target surface being less than a predetermined step-height threshold or an amount of exposed area of the non-target surface being less than the predetermined exposed area threshold. In another embodiment, corrective action to address a non-conforming attribute may include adding further additive material to the workpiece when the non-conforming attribute is based, at least in part, on a thickness of the additive material overlying the target surface being less than a predetermined thickness threshold. In another embodiment, corrective action to address a non-conforming attribute may include etching the workpiece when the non-conforming attribute is based, at least in part, on a remaining additive material on the non-target surface or a remaining self-assembled monolayer on the non-target surface being greater than a predetermined remaining thickness threshold. In yet another embodiment, corrective action to address a non-conforming attribute may include treating the workpiece when the non-conforming workpiece attribute is based, at least in part, on a reflectivity from the workpiece being less than a predetermined reflectivity threshold, wherein the treating is a temperature treatment, a plasma etch treatment, or combination thereof.

As disclosed herein the term "metrology module" or "measurement module" refers to a module/system/sensor/tool that can make measurements on a workpiece to detect or determine various non-conformities or variations on the workpiece, such as parametric variations, or to detect or determine defects on the workpiece, such as a contamination of some kind. As used herein, the term "inspection system" will generally refer to the tool or system of a measurement process or module that measures and collects data or signals associated with the measurement. The measurement modules will make measurements and provide data for use in the processing platform as disclosed further herein. The terms "metrology module" and "measurement module" will be used interchangeably herein, and generally refer to measurement or metrology or sensing tools used to detect and measure attributes of a workpiece that are indicative of the processing of the workpiece and the layers and devices being formed thereon.

To move workpieces between the various processing modules, the common manufacturing platform will generally incorporate one or more workpiece transfer modules that are hosted on the common manufacturing platform and are configured for the movement of the workpiece between the processing modules and the measurement module(s). A measurement module might be coupled with the workpiece transfer module similar to a processing module. In some embodiments of the invention, as disclosed herein, a measurement module or the inspection system associated therewith is incorporated with or inside a transfer module to provide for measurement or metrology as the workpiece is moved between processing modules. For example, a measurement module, or a portion thereof, might be positioned inside an internal space of the transfer module. Herein, the combination transfer and measurement apparatus will be referred to as a transfer measurement module ("TMM").

In one embodiment, the common manufacturing platform including both processing chambers and measurement modules is actively controlled by a system that processes the measured data associated with an attribute on the workpiece and uses the measured data for controlling movement and processing of the workpiece in a processing sequence. In accordance with embodiments of the invention, the control system uses measured data and other data to perform corrective processing based in part on the measured data to provide active interdiction of the processing sequence to correct non-conformities or defects. More specifically, an active interdiction control system is hosted on the common manufacturing platform and is configured to perform corrective processing based in part on the measured data, wherein the corrective processing of the workpiece might be performed in the processing modules of the platform that are upstream or downstream in the process sequence to address situations where non-conformities or defects are detected. In an embodiment of the invention, the workpiece is maintained in a controlled environment, such as under vacuum, for example. That is, on the common manufacturing platform, the processing modules and the measurement module operate in a controlled environment, and the workpiece transfer module transfers the workpiece between the plurality of processing modules in the processing sequence and one or more measurement modules without leaving the controlled environment.

As used herein, the term "active interdiction" refers generally to the control system as implemented for capturing measurement/metrology data in real time with respect to various fabrication processes to obtain data on workpiece attributes and thereby detect non-conformities or defects and the corrective aspects of the control to correct or ameliorate the non-conformities or defects. The active interdiction control system uses the data for correction and amelioration of various non-conformities in the semiconductor fabrication process by actively varying the processing sequence and/or the operation of modules that perform process steps. Thus, the active interdiction control system also interfaces with one or more transfer modules (e.g., 410) used to move workpieces through the process. The active interdiction control system (622 in FIGS. 6 and 722 in FIGS. 7A-7D, as further described below) coordinates the data collection and data analysis and detection of non-conformities with the fabrication process and further directs the actions of multiple processing modules so as to address the non-conformities or defects that are detected. The active interdiction control system is implemented generally by one or more computer or computing devices as described herein that operate a specially designed sets of programs such as deep learning programs or autonomous learning components referred to collectively herein as active interdiction components. As may be appreciated, the active interdiction control system may incorporate multiple programs/components to coordinate the data collection from various measurement modules and the subsequent analysis. The active interdiction control system interfaces with the multiple processing modules in the common manufacturing platform in order to address various measured non-conformities/defects to correct or ameliorate the non-conformities/defects. The active interdiction control system will thereby control one or more of the processing modules and the processing sequence to achieve the desired results of the invention, which may be referred to as the target conditions or predetermined thresholds.

The active interdiction control system also controls the transfer modules in order to move the workpieces to upstream and/or downstream processing modules when non-conformities/defects are detected. That is, depending upon what is detected, the system of the invention may move the workpiece further along in the processing sequence, or may direct the workpiece to a correction module or to an upstream processing module to correct or otherwise address a detected non-conformity or defect. As such, feedforward and feedback mechanisms are provided through the transfer modules to provide the active interdiction of the invention. Furthermore, the processing sequence might be affected upstream or downstream for future workpieces.

The active interdiction features of the invention improve performance, yield, throughput, and flexibility of the manufacturing process using run-to-run, wafer-to-wafer, within the wafer and real-time process control using collected measurement/metrology data. The measured data is collected, in real time during the processing, without removing the workpiece/substrate/wafer from the controlled processing environment. In accordance with one feature of the invention, in a common manufacturing platform, the measurement data may be captured while the substrate remains in a controlled environment, such as under vacuum, for example. That is, the workpiece transfer module(s) are configured for transferring the workpiece between the plurality of processing modules and the measurement modules without leaving the controlled environment. The active interdiction control can provide a multivariate, model-based system that is developed in conjunction with feed-forward and feedback mechanisms to automatically determine the optimal recipe for each workpiece based on both incoming workpieces and module or tool state properties. The active interdiction control system uses fabrication measurement data, process models and sophisticated control algorithms to provide dynamic fine-tuning of intermediate process targets that enhance final device targets. The interdiction system enables scalable control solutions across a single chamber, a process tool, multi-tools, a process module and multi-process modules on a common manufacturing platform using similar building blocks, concepts, and algorithms as described herein.

Figure 6:
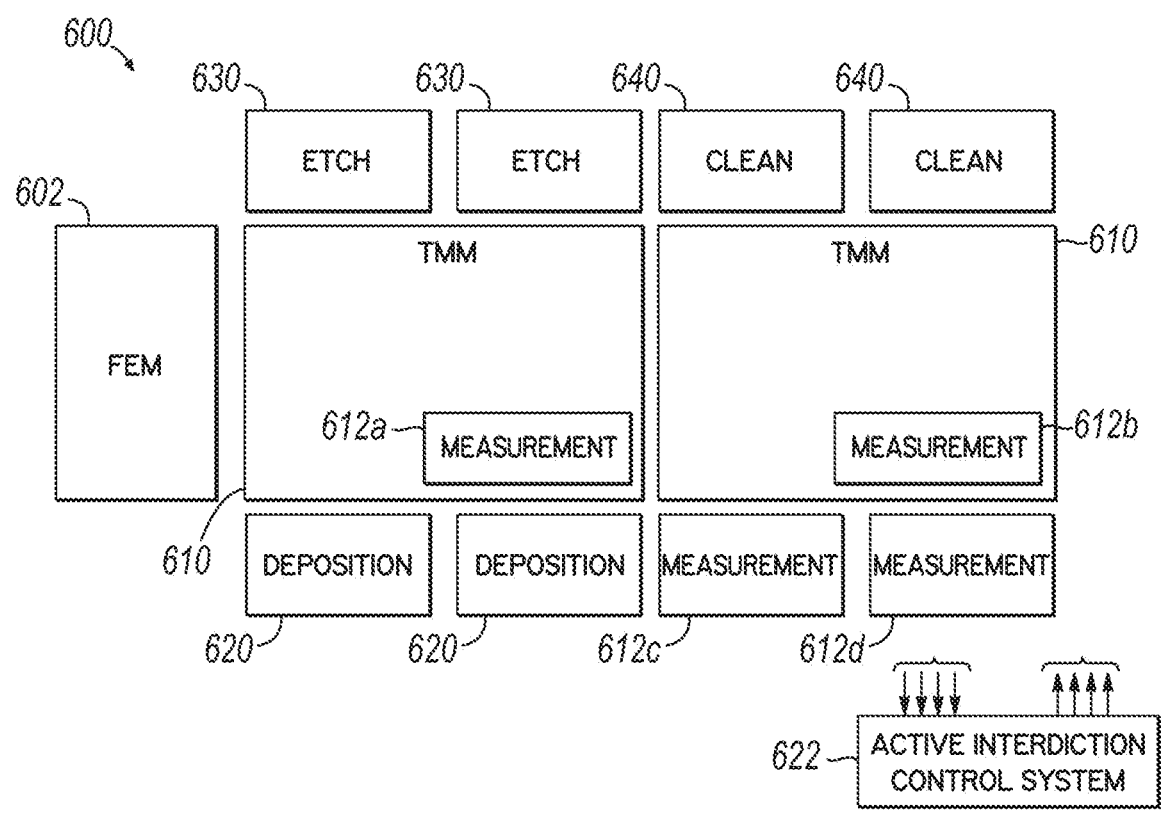
FIG. 6 is a schematic diagram illustrating one embodiment of a common manufacturing platform for performing an integrated sequence of processing steps.

FIG. 6 is a schematic diagram of another system for implementing an embodiment of the present invention on a common manufacturing platform 600. The platform 600 incorporates a plurality of processing modules/systems for performing integrated workpiece processing and workpiece measurement/metrology under the control of an active interdiction control system 622 according to embodiments of the invention. FIG. 6 illustrates an embodiment of the invention wherein one or more workpiece measurement modules are coupled together with one or more workpiece processing modules through one or more transfer modules. In that way, in accordance with features of the invention, an inspection of the workpiece may be made to provide the measurement data associated with an attribute of the workpiece, such as regarding material properties of the workpiece and the various thin films, layers and features that are formed on the workpiece while the workpiece remains within the common manufacturing platform. As discussed herein, measurements and analysis may be made immediately upon completion of processing steps, such as an etch or deposition step, and the measurement data gathered may be analyzed and then used within the common manufacturing platform to address any measurements or features that are out of specification or non-conformal or represent a defect with respect to the workpiece design parameters. The workpiece does not need to be removed from the common manufacturing platform to take corrective action, but rather, can remain under the controlled environment.

Referring to FIG. 6, common manufacturing platform 600 is diagrammatically illustrated. Platform 600 includes a front-end module 602 for introducing one or more workpieces into the manufacturing platform. As is known, the front-end module (FEM) may incorporate one or more cassettes holding the workpieces. The front-end module may be maintained at atmospheric pressure but purged with an inert gas to provide a clean environment. One or more workpieces may then be transferred into a transfer module 610, such as through one or more load-lock chambers (not shown) as discussed herein. The transfer modules of FIG. 6 are transfer measurement modules (TMM) that include measurement tools or inspection systems integrated therein for capturing data from a workpiece. Multiple TMM's 610 may be interfaced for providing movement of a workpiece through a desired sequence. The transfer measurement modules 610 are coupled with a plurality of processing modules. Such processing modules may provide various different processing steps or functions and may include one or more etch modules 630, one or more film-forming modules 620, one or more cleaning modules 640, and one or more measurement modules 612*a*, 612*b*, 612*c*, 612*d*. In accordance with embodiments of the invention as disclosed further herein, measurement modules may be accessed through the transfer modules 610 before or after each processing step. In one embodiment, the measurement modules, such as 612*c*, 612*d*, are located outside of the transfer modules 610 and are accessed to insert and receive workpieces similar to the various processing modules and may be referred to herein as metrology modules that reside within the controlled environment of the common manufacturing platform 600. Alternatively, measurement modules or at least a portion thereof, such as modules 612*a*, 612*b*, may be located in a respective transfer module. More specifically, all or a portion of a measurement module 612*a*, 612*b* is located in a transfer module 610 to define a measurement region therein where a workpiece might be positioned for measurement during a transfer process. The measurement region is located in a dedicated area of the transfer module 610 and is accessible by the transfer mechanism of the transfer module for positioning the workpiece. As noted, this makes the transfer module essentially a transfer measurement module (TMM) as discussed herein.

Generally, the transfer module defines a chamber therein that houses a transfer robot that is capable of moving workpieces, under vacuum, through various gate valves and access or transfer ports into various processing modules or measurement modules. By maintaining the measurement modules on the common manufacturing platform 600, they are readily accessed, such as between one or more of the processing steps to provide the necessary measured analytical data on-the-fly that will be used to address any workpiece out of specification or otherwise non-conformal with the workpiece design plans for a particular workpiece or to address detectable defects. In that way, real time data is provided to allow a fabricator to recognize problems early in the system so that remedial action may be taken in the current processing sequence, such as in a following processing step, in a previous processing step, and/or in a future processing step depending upon the captured data and the detected non-conformities or defects. In that way, productivity and efficiency may be increased, process monitoring overhead may be reduced, and wasted product, in the form of rejected or ejected workpieces may be reduced. This all provides a significant cost savings to a fabricator or device maker.

As noted, in one embodiment of the invention that incorporates the active interdiction control system 622, one or more measurement modules are hosted on a common manufacturing platform with processing modules for providing measured data regarding an attribute of the workpiece. The data is used by the active interdiction control system 622 for detecting non-conformities and for performing corrective processing of the workpiece when non-conformities are detected. The corrective processing is performed upstream and/or downstream in the process sequence when non-conformities are detected.

Figure 7A:
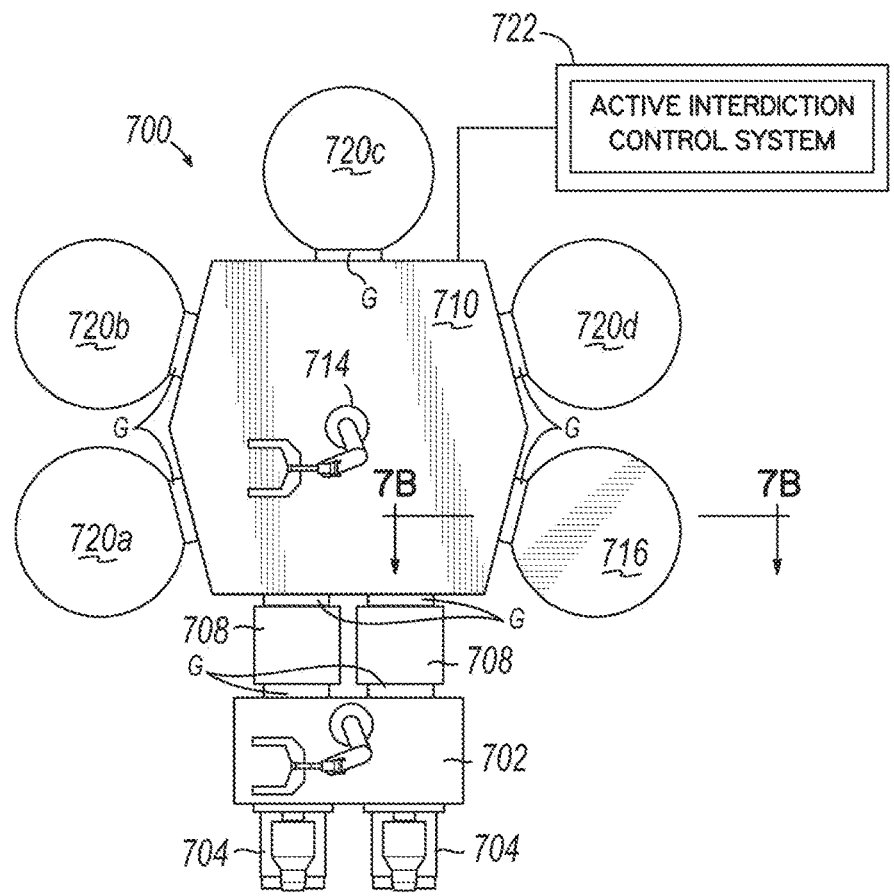
FIG. 7A is a schematic diagram illustrating in top view another embodiment of a common manufacturing platform for performing an integrated sequence of processing steps.

Referring to FIG. 7A, an exemplary common manufacturing platform 700 suitable for practicing a method of ASD is illustrated. The common manufacturing platform 700 incorporates multiple modules and processing tools for the processing of semiconductor substrates for the fabrication of integrated circuits and other devices. The common manufacturing platform 700 incorporates one or more metrology/measurement modules that are incorporated within the common manufacturing platform 700 along with the processing modules. For example, the platform 700 may incorporate a plurality of processing modules that are coupled to a transfer module as shown. In some embodiments, a measurement module or tool is also positioned, at least partially, inside the transfer module. As such, a workpiece may be processed and then transferred immediately to a measurement module in order to collect various fabrication data associated with attributes of the workpiece that is further processed by the active interdiction control system. The active interdiction control system gathers data from the processing and measurement modules and controls a process sequence that is executed on the common manufacturing platform through the selective movement of the workpiece and control of one or more of the plurality of processing modules. Furthermore, the processing system of platform 700 may transfer a workpiece inside the chamber of the transfer module and between the various processing modules and the measurement/metrology modules without leaving the controlled environment of the common manufacturing platform 700. The active interdiction control system controls the sequential process flow through the various processing modules utilizing information that is derived from workpiece measurements obtained from the one or more measurement modules. Furthermore, the active interdiction control system incorporates processing modules in-situ measurements and data to control the sequential process flow through the platform 700. The on-substrate measurement data obtained in the controlled environment may be utilized alone or in combination with the in-situ processing module measurement data for process flow control and improvement of the process in accordance with the invention.

Turning again to FIG. 7A, common manufacturing platform 700 contains a front-end module 702 to introduce workpieces into the controlled environment. The exemplary platform 700 includes a plurality of processing modules 720a-720d and one or more measurement/metrology modules 716 organized around the periphery of a workpiece transfer module 710. Common manufacturing platform 700 includes cassette modules 704 and load-lock chambers 708 coupled to front-end module 702. The front-end module 702 is generally maintained at atmospheric pressure, but a clean environment may be provided by purging with an inert gas. Load-lock chambers 708 are coupled to the centralized workpiece transfer module 710 and may be used for transferring workpieces from the front-end module 702 to the workpiece transfer module 710 for processing in the controlled environment of the platform 700.

The workpiece transfer module 710 may be maintained at a very low base pressure (e.g., $5 \times 10^{-8}$ Torr, or lower) or constantly purged with an inert gas. In accordance with the invention, a measurement/metrology module 716 may be operated under atmospheric pressure or operated under vacuum conditions. In accordance with one embodiment, the measurement module 716 is kept at vacuum conditions and the wafer is processed in platform 700 and measured without leaving vacuum. As disclosed further herein, the metrology module may include one or more inspection systems or analytical tools that are capable of measuring one or more material properties or attributes of a workpiece and/or of the thin films and layers deposited on the workpiece or the devices formed on the workpiece. As used herein, the term "attribute" is used to indicate a measurable feature or property of a workpiece, layer on a workpiece, feature or device on a workpiece, etc. that is reflective of the processing quality of the processing sequence. The measured data associated with an attribute is then used to adjust the process sequence by analyzing the measured data along with other in-situ processing data through the active interdiction control system. For example, the measured attribute data reflects non-conformities or defects on the workpiece for providing corrective processing.

FIG. 7A illustrates essentially a single measurement module 716. However, the particular common manufacturing platform 700 may incorporate a plurality of such measurement modules that are incorporated around one or more workpiece transfer systems, such as the workpiece transfer module 710. Such measurement modules 716 may be stand-alone modules that are accessed through the transfer module 710 like a processing module. Such stand-alone modules will generally incorporate inspection systems therein that are configured to engage a workpiece that is positioned in a measurement region of the module and to measure data associated with an attribute of the workpiece.

In an alternative embodiment of the invention, a measurement module might be implemented in a measurement region located within a dedicated area of an internal space of the transfer chamber defined by the transfer module 710. Still further, a measurement module might be incorporated wherein at least a portion of the measurement module is positioned inside of an internal space of a workpiece transfer module, and other components of the measurement module or the specific inspection system of the measurement module are incorporated outside of the workpiece transfer module and interfaced through an aperture or window into a dedicated area of the internal space that forms the measurement region in which a workpiece is located or through which a workpiece will pass.

The measurement modules of the inventive system and platform include one or more inspection systems that are operable for measuring data associated with an attribute of the workpiece. Such data may be associated with one or more attributes that reflect the quality of the processing sequence and the quality of the layers and features and devices that are being formed on a workpiece. The collected measurement data is then analyzed, along with processing module data, by an active interdiction control system for detecting various non-conformities and/or defects on the workpiece or workpiece layers/features. The system then provides for corrective processing of the workpiece, such as in upstream or downstream processing modules in the process sequence to ameliorate/correct the non-conformities or defects and improve the overall process.

In accordance with embodiments of the invention, the measurements taken by the measurement module or inspection systems thereof and the data generated is associated with one or more attributes of a workpiece. For example, the attribute measured may include, for example, on or more of: a layer thickness, a layer conformality, a layer coverage, a layer profile of a layer on the workpiece, an edge placement location, an edge placement error (EPE) for certain features, a critical dimension (CD), a block critical dimension (CD), a grid critical dimension (CD), a line width roughness (LWR), a line edge roughness (LER), a block LWR, a grid LWR, a property relating to selective deposition process(es), a property relating to selective etch process(es), a physical property, an optical property, an electrical property, a refractive index, a resistance, a current, a voltage, a temperature, a mass, a velocity, an acceleration, or some combination thereof associated with the fabricated electronic devices on the workpiece. The list of measured attributes for generating measurement data for the invention is not limited and could include other attribute data that might be used for processing a workpiece and fabricating devices.

As further discussed herein, the measurement modules and/or inspections systems used for providing attribute data may implement a number of tools and methods for measurement for providing the measurement and metrology of the invention. The measurement modules and/or inspections systems may include optical methods, or non-optical methods. Optical methods can include high-resolution optical imaging and microscopy (e.g., bright-field, dark-field, coherent/incoherent/partially coherent, polarized, Nomarski, etc.), hyperspectral (multi-spectral) imaging, interferometry (e.g., phase shifting, phase modulation, differential interference contrast, heterodyne, Fourier transform, frequency modulation, etc.), spectroscopy (e.g., optical emission, light absorption, various wavelength ranges, various spectral resolutions, etc.), Fourier transform Infrared spectroscopy (FTIR) reflectometry, scatterometry, spectroscopic ellipsometry, polarimetry, refractometers, etc. Non-optical methods can include electronic methods (e.g., RF, microwave, etc.), acoustic methods, photo-acoustic methods, mass spectroscopy, residual gas analyzers, scanning electron microscopy (SEM), transmission electron microscopy (TEM), atomic force microscopy (AFM), energy dispersive x-ray spectroscopy (EDS), x-ray photo-emission spectroscopy (XPS), etc. For example, the inspection system used for measuring data that is associated with an attribute of the workpiece may use one or more of the following techniques or devices: optical thin film measurement, such as reflectometry, interferometry, scatterometry, profilometry, ellipsometry; X-Ray measurements, such as X-ray photo-emission spectroscopy (XPS), X-Ray fluorescence (XRF), X-Ray diffraction (XRD), X-Ray reflectometry (XRR); ion scattering measurements, such as ion scattering spectroscopy, low energy ion scattering (LEIS) spectroscopy, auger electron spectroscopy, secondary ion mass spectroscopy, reflection absorption IR spectroscopy, electron beam inspection, particle inspection, particle counting devices and inspection, optical inspection, dopant concentration metrology, film resistivity metrology, such as a 4-point probe, eddy current measurements; a micro-balance, an accelerometer measurement, a voltage probe, a current probe, a temperature probe for thermal measurements, or a strain gauge. The list of measurement techniques or devices for generating measurement data for the invention is not limited and could include other techniques or devices that might be used for obtaining the useful data for processing a workpiece and fabricating devices in accordance with the invention.

The measurement modules and/or inspection systems may take measurements on various substrate or workpiece structures passed through the processing system including either product workpieces, or non-product substrates, i.e., a monitoring substrate. On product workpieces, measurements can be performed on designated target structures, both device-like structures and device-unlike structures, on specified device areas, or on arbitrary areas. The measurements may also be performed on test structures created on the workpiece, that might include pitch structures, area structures, density structures, etc.

Referring again to FIG. 7A, coupled to the transfer chamber 710 are a plurality of processing modules 720a-720d that are configured for processing substrates, such as semiconductor or silicon (Si) workpieces. The Si workpieces can, for example, have a diameter of 150 mm, 200 mm, 300 mm, 450 mm, or larger than 450 mm. The various processing modules and measurement modules all interface with the workpiece transfer module 710 through appropriate gate access ports with valves G, for example. According to one embodiment of the invention disclosed herein, the first processing module 720a might perform a treatment process on a workpiece, and the second processing module 720b might form a self-aligned monolayer (SAM) on a workpiece. The third processing module 720c may deposit a film on a workpiece by a suitable selective deposition process, and the fourth processing module 720d may selectively etch or clean a workpiece.

The transfer module 710 is configured for transferring workpieces between any of the processing modules 720a-720d and then into the metrology module 716 either before or after a particular processing step. FIG. 7A further shows the gate valves G that provide isolation at the access ports between adjacent processing chambers/tool components. As depicted in the embodiment of FIG. 7A, the processing modules 720a-720d and the metrology module 716 may be directly coupled to the transfer chamber 710 by the gate valves G and such direct coupling can greatly improve substrate throughput in accordance with the invention.

The common manufacturing platform 700 includes one or more controllers or control systems 722 that can be coupled to control the various processing modules and associated processing chambers/tools depicted in FIG. 7A during the integrated processing and measurement/metrology process as disclosed herein. The controller/control system 722 can be coupled to one or more additional controllers/computers/databases (not shown) as well. Control system 722 can obtain setup and/or configuration information from an additional controller/computer or a server over a network. The control system 722 is used to configure and run any or all of the processing modules and processing tools and to gather data from the various measurement modules and in-situ data from the processing modules to provide the active interdiction of the invention. The controller 722 collects, provides, processes, stores, and displays data from any or all of the processing modules and tool components. The control system 722, as described further herein, can comprise a number of different programs and applications and processing engines to analyze the measured data and in-situ processing data and to implement algorithms, such as deep learning networks, machine learning algorithms, autonomous learning algorithms and other algorithms for providing the active interdiction of the invention.

As described further herein, the active interdiction control system 722 can be implemented in one or more computer devices having a microprocessor, suitable memory, and digital I/O port and is capable of generating control signals and voltages that are sufficient to communicate, activate inputs to the various modules of the platform 700, and exchange information with the substrate processing systems run on the platform 700. The control system 722 monitors outputs from the processing system of the platform 700 as well as measured data from the various measurement modules of the platform to run the platform. For example, a program stored in the memory of the control system 722 may be utilized to activate the inputs to the various processing systems and transfer systems according to a process recipe or sequence in order to perform desired integrated workpiece processing.

The control system 722 also uses measured data as well as in-situ processing data output by the processing modules to detect non-conformities or defects in the workpiece and provide corrective processing. As discussed herein, the control system 722 may be implemented as a general-purpose computer system that performs a portion or all of the microprocessor-based processing steps of the invention in response to a processor executing one or more sequences of one or more instructions contained in a program in memory. Such instructions may be read into the control system memory from another computer readable medium, such as a hard disk or a removable media drive. One or more processors in a multi-processing arrangement may also be employed as the control system microprocessor element to execute the sequences of instructions contained in memory. In alternative embodiments, hard-wired circuitry may be used in place of or in combination with software instructions for implementing the invention. Thus, embodiments are not limited to any specific combination of hardware circuitry and software for executing the metrology driver processes of the invention as discussed herein.

The active interdiction control system 722 may be locally located relative to the platform 700, or it may be remotely located relative to the platform 700. For example, the controller 722 may exchange data with the platform 700 using at least one of a direct connection, an intranet connection, an Internet connection or a wireless connection. The control system 722 may be coupled to an intranet at, for example, a customer site (i.e., a device maker, etc.), or it may be coupled to an intranet at, for example, a vendor site (i.e., an equipment manufacturer). Additionally, for example, the control system 722 may be coupled to other systems or controls through an appropriate wired or wireless connection. Furthermore, another computer (i.e., controller, server, etc.) may access, for example, the control system 722 to exchange data via at least one of a direct wired connection or a wireless connection, such as an intranet connection, and/or an Internet connection. As also would be appreciated by those skilled in the art, the control system 722 will exchange data with the modules of the common manufacturing platform 700 via appropriate wired or wireless connections. The processing modules may have their own individual control systems (not shown) that take input data for control of the processing chambers and tools and subsystems of the modules and provide in-situ output data regarding the process parameters and metrics during the processing sequence.

Figure 7B:
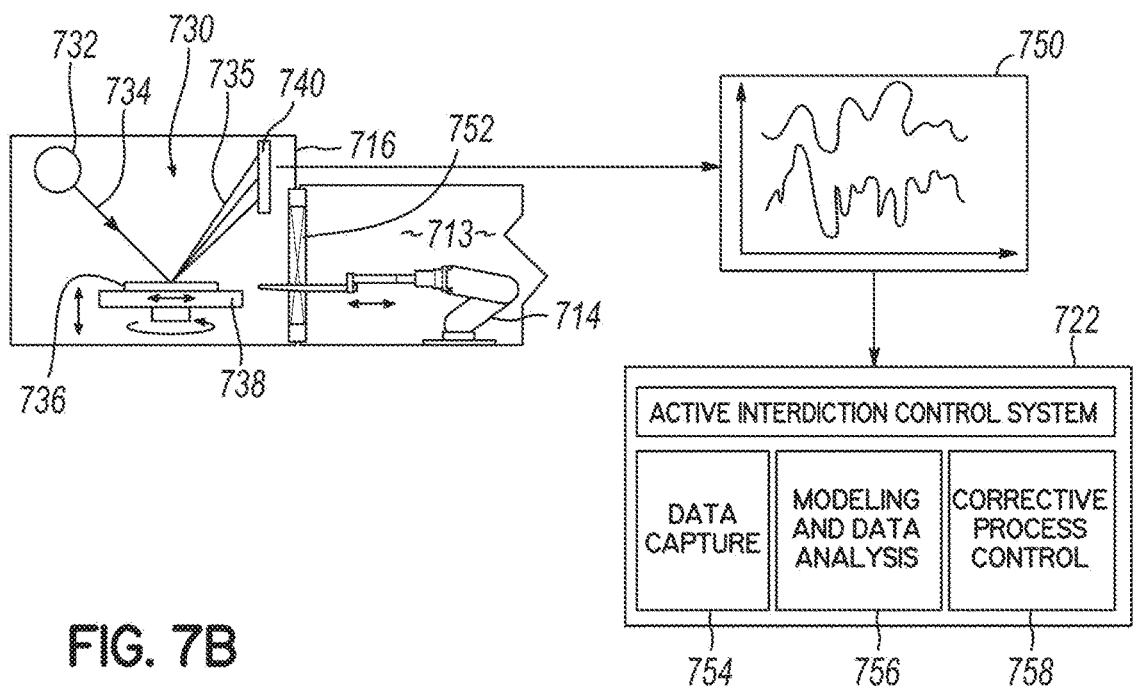
FIG. 7B is a side view in partial cross-section of a measurement module incorporated in the common manufacturing platform of FIG. 7A.

With specific reference to FIGS. 7A and 7B, and in accordance with one embodiment, measurement data may be obtained in a measurement/metrology module 716 that is a separate module on the platform 700 coupled to the transfer module 710. Generally, the transfer module 710 has a chamber that incorporates one or more transfer mechanisms or robots 714 that will handle and move workpieces through the internal space of the chamber and into and out of the processing module in the processing sequence.

More specifically, the transfer mechanism 714 is positioned inside of the internal space 713 of the transfer module 710 that can define a controlled environment and is configured for moving the workpieces through the internal space and environment and selectively in and out of the plurality of processing modules 720a-720d and the measurement modules 716 or into and out of a measurement region in a dedicated area of the internal space in order for a measurement inspection system to measure data. In accordance with one feature of the invention, because the internal space 713 of the transfer module 710 and processing modules 720a-720d and measurement modules 716 are coupled together on the common manufacturing platform 700, the controlled environment may be maintained for the workpiece generally through most of or all of the measurement and processing sequence. Such a controlled environment could involve a vacuum environment or an inert gas atmosphere in the transfer module or measurement module.

Figure 7C:
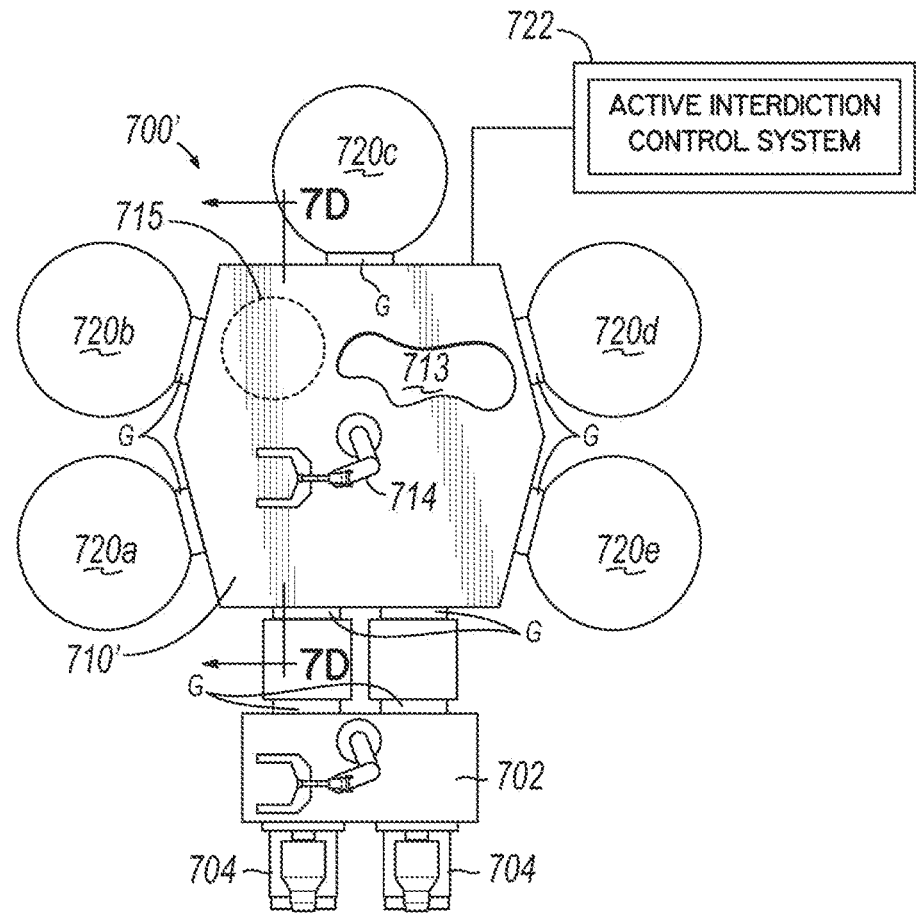
FIG. 7C is a schematic diagram illustrating in top view another embodiment of a common manufacturing platform for performing an integrated sequence of processing steps.
Figure 7D:
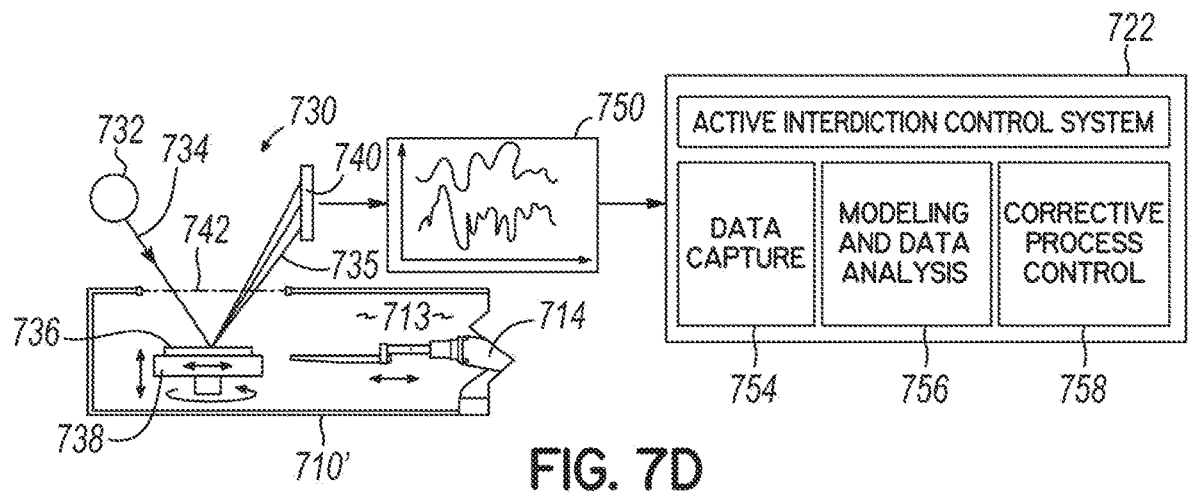
FIG. 7D is a side view in partial cross-section of a measurement module incorporated in the common manufacturing platform of FIG. 7C.

The transfer module 710 includes a plurality of access ports or side ports, each with a suitable gate G, through which a workpiece is moved to and from the plurality of processing modules 720a-720d. To provide the necessary processing sequence for efficient through-put on platform 700, the plurality of processing modules 720a-720d includes modules that handle a variety of workpiece processing steps on the common platform, including one or more etching modules and one or more film-forming or deposition modules. The measurement module 716, as illustrated in FIG. 7A is coupled with the transfer module 710 also at one of the side or access ports through a suitable gate G. In other embodiments, the measurement module is coupled with the transfer module at a port formed in the top of the transfer module. In still further embodiments as described herein, the transfer module acts as a measurement module as well wherein at least a portion of the measurement module for capturing measurement data is incorporated or positioned inside of an internal space of the transfer module. The transfer measurement module (TMM) in such an embodiment, as illustrated in FIGS. 7C-7D, includes a measurement region located within a dedicated area of the internal space of the transfer module.

The active interdiction control system 722 collects workpiece measurement data generally on-the-fly as the substrate moves in the processing sequence between one or more of the processing modules and the measurement/metrology module 716. The data is captured and then analyzed and processed to detect non-conformities and defects and provide corrective processing as discussed herein. The active interdiction control system 722 provides the necessary control of the processing steps of the sequence to make control adjustments to various fabrication processing steps as performed in order to correct for the detected non-conformities/defects. Adjustments may be made to process steps and processing modules that precede or are upstream of the captured measurement data and/or process steps that follow or are downstream of the measurement data in sequence. Alternatively, a suitable corrective action or corrective processing might include ejection of the workpiece from the platform 700 in order to not waste further time and materials on a workpiece which cannot be saved.

Referring to FIG. 7B, one exemplary measurement module 716 is illustrated that incorporates an inspection system 730 for making measurements on the workpiece in real-time with respect to the processing sequence executed on common manufacturing platform 700.

The inspection system 730 measures data associated with an attribute of the workpiece, as discussed herein. The inspection system 730 incorporates one or more signal sources 732 that direct a measurement signal 734 toward a workpiece 736. Incident signals 734 are reflected or scattered from the surface of the workpiece 736 and the scattered signals 735 are captured by the detector 740. The detectors 740 generate measurement data 750 which may then be directed to the active interdiction control system 722 as described herein. In one embodiment, the workpiece 736 is positioned by transfer mechanism 714 on a measurement platform 738 that may be translated side-to-side and up and down and rotated as indicated by the arrows in FIG. 7B so that a measurement signal 734 may be directed to various proper positions on the workpiece 736.

That is, in the embodiment of FIG. 7B, the measurement module includes a separate support mechanism 738 for supporting a workpiece 736 positioned in the measurement module 716. The inspection system engages the support mechanism 738 for measuring data associated with a workpiece attribute supported on the support mechanism. In such a scenario, the support mechanism 738 in the measurement module 716 is generally separate from the transfer mechanism that otherwise moves the workpiece 736 and positions it on the support mechanism.

The separate support mechanism translates the workpiece 736, such as through vertical and/or horizontal movement and also may rotate the workpiece 736 to provide at least two degrees of freedom for measuring data associated with an attribute of the workpiece 736 as discussed herein. The support mechanism may also incorporate a temperature control element therein for controlling workpiece temperature. Therefore, in the embodiment of FIG. 7B, the support mechanism provides the support and movement of the workpiece 736 necessary for the measurement of data after the workpiece 736 is positioned thereon by the transfer mechanism. In an alternative embodiment, the transfer mechanism may provide the function of supporting and moving the workpiece 736 for engagement with the inspection system 730 for measuring data associated with an attribute on the workpiece 736.

The captured measurement data 750 may then be directed to control system 722 and further evaluated and analyzed to determine a particular action for the measured workpiece. If the measurement data indicates that the measured parameters are within specification of the desired design and fabrication process, and/or there are no actionable detected defects, the workpiece may proceed as normal through the process flow within the platform 700. Alternatively, if the measured data 750 indicates that the workpiece is beyond correction or amelioration, the workpiece might be ejected from further processing. Alternatively, in accordance with an embodiment of the invention, the active interdiction control system 722 may analyze the data and provide corrective processing as one or more corrective steps to be taken for that workpiece or to be made in various process steps of the overall process flow in order to correct the current workpiece, and also to prevent the need for corrective action in other workpieces that are subsequently processed on the platform 700. Specifically, referring to FIG. 7B, the active interdiction control system 722 may incorporate one or more processing steps and processing components therein for yielding correction to the process flow. First, the necessary measurement data 750 may be captured and pre-processed as illustrated by block 754. Next, modeling and data analysis occurs on the captured data as well as any in-situ processing data associated with one or more of the processing modules and process steps as indicated by block 756. The modeling and analysis may utilize artificial intelligence, including deep learning and autonomous learning programs and components. Next, the analysis may provide corrective process control wherein one or more of the processing steps and processing modules are controlled to correct or ameliorate perceived or detected non-conformities or defects in the layers and features that are out of specification with respect to the overall design for the workpiece fabrication. The corrective process control of block 758 may be provided to one or more of the processing steps or processing modules and it may be applied to one or more processing steps that are previous in time (upstream) to the capture of the measurement data 750 or may be applied to one or more of the process steps to follow (downstream) the capture of the measurement data 750 within the overall substrate fabrication according to the desirable design. The active interdiction control system 722, and its processes as indicated by blocks 754, 756 and 758 may be incorporated in software run by one or more computers of the control system 722 and/or components of that system.

In accordance with embodiments of the invention, the inspection systems for obtaining measurement data engage the workpiece by performing contact measurement or metrology or non-contact measurement or metrology depending on the attribute measured or the type of measurement. A combination of both contact and non-contact measurement might be used. Depending on the location of the inspection system, portions of the inspection system may be positioned partially or entirely inside an internal space or chamber of a module. In the embodiment of FIG. 7A as disclosed herein, dedicated measurement modules 716 may entirely contain the inspection system. Alternatively, a portion of a measurement module might be positioned inside of an internal space of a chamber, such as inside an internal space of a workpiece transfer module, with another portion of the measurement module located outside of the chamber. Such an embodiment is illustrated in FIG. 7D for example wherein a transfer measurement module is illustrated using a measurement region located within a dedicated area of the transfer chamber internal space and the inspection system is configured for engaging a workpiece positioned in the measurement region for measuring data associated with an attribute on the workpiece.

Support mechanism 738 or transfer mechanism 714 holding workpiece 736 may be translated and rotated to provide measurements of various areas on the workpiece 736. In that way, measurement data may be captured at various portions or segments of the entire workpiece. Thus, continuous measurements or point-by-point measurements are possible thereby reducing the overall measurement time and processing time.

For example, the inspection system measures data over a portion of the workpiece that is equal to or exceeding 1 square centimeter. Alternatively, the inspection system measures or images a substantive portion of the workpiece that is equal to or exceeding 90% of the working surface area of the workpiece. As noted, the inspection system may perform a measurement at plural discrete locations on the working surface of the workpiece or may perform a continuous sequence of measurements across a portion of the workpiece. For example, the inspection system may perform a measurement along a path extending across or partially across the workpiece. Such a path may include a line, a sequence of lines, an arc, a circular curve, a spiral curve, an Archimedean spiral, a logarithmic spiral, a golden spiral, or some combination thereof. Also, there may be several inspection systems wherein source/detector pairs 732, 740 may each represent a different inspection signal from a different inspection system and may be different forms of signals. For example, one source/detector pair 732, 740 might use an optical signal while another source/detector pair 732, 740 might use an electromagnetic signal, depending on the inspection system.

The inspection system(s) can perform multiple measurements of attributes on a workpiece while the workpiece is in a measurement module or in dedicated area of a transfer measurement module as discussed herein. The measurements may be made simultaneously in time. That is, different inspection systems might make measurements at the same time. Alternatively, the various inspection systems might operate at different times. For example, it may be necessary to move or position the workpiece in one position for one type of measurement or inspection system, and then move or position the workpiece for another measurement by the same or a different type of inspection system.

The inspection system(s) may be non-contact systems for providing non-contact measurement and metrology. Alternatively, one or more inspection systems of a measurement module or transfer measurement module might use a contact sensor that may be moved and positioned at a surface of the workpiece to make a measurement. The inspection systems provided in accordance with the invention may incorporate a combination of contact inspection systems and non-contact inspection systems for gathering measurement data associated with an attribute of the workpiece.

As described above, the inspection system as implemented in a measurement module or in a transfer measurement module may be stationary while the support mechanism or workpiece transfer mechanism moves the workpiece to engage with the inspection system and to take measurements in different areas of the workpiece. Alternatively, the inspection system 730, or some portion thereof, is movable with respect to the workpiece support mechanism 738, the workpiece transfer mechanism 714 and the module. The inspection system might be configured to translate and/or rotate with respect to the stationary workpiece to obtain measurement data from areas of the workpiece.

In other embodiments of the invention, the inspection system may be embedded in or part of a workpiece support mechanism. The inspection system 730 might be mounted or supported on the support mechanism 738. Then, when the workpiece is positioned on the support mechanism, it will be in a proper position for engagement by the inspection system. An inspection system 730 might be embedded in the support mechanism so as to sit below or otherwise proximate to a positioned workpiece to provide measurement data associated with a mass measurement or a temperature measurement of the workpiece, for example.

FIG. 7C illustrates a common manufacturing platform 700' incorporating a transfer module 710' in accordance with one embodiment the invention that utilizes a dedicated area to form a measurement region wherein measurement data may be gathered from a workpiece during transit. In that way, as noted herein, the workpiece can be processed and measured while remaining within a controlled environment, such as a vacuum environment. The workpiece does not need to leave the environment of the platform 700' for determining how the process is proceeding and for detecting any non-conformities or defects. Accordingly, the embodiment as illustrated in FIG. 7CA forms a transfer measurement module (TMM) that may be utilized with one or more processing modules or as part of a common manufacturing platform. Furthermore, multiple transfer measurement modules may be utilized and interfaced together to cooperate and form a larger common manufacturing platform.

The inspection systems incorporated within a transfer measurement module (TMM) operate in and are similar to other inspection systems as described herein. Such inspection systems as illustrated in FIG. 7D, for example, only illustrate certain inspection systems. However, other inspection systems and features, such as those discussed above, would also be applicable to the transfer mechanism module is illustrated in FIG. 7C. As such, some common reference numerals are utilized in FIGS. 7C-7D as previously discussed herein.

The platform 700' incorporates a workpiece transfer module 710' that provides measurement/metrology data. The transfer measurement module (TMM) 710' includes a workpiece transfer mechanism, such as in the form of a handling robot 714 within the internal space of a transfer chamber 713. The transfer mechanism 714 is operable as in platform 700 to move one or more workpieces through the transfer module 710' and between various of the processing modules that are coupled to transfer module 710' in the common manufacturing platform. In accordance with one feature of the invention, transfer chamber 713 defines an internal space that includes a dedicated area that is used for measurement. The measurement region 715 of the TMM 710' is located in the dedicated area. The measurement region/area 715 is proximate to one or more inspection systems 730 for measurement.

More specifically, the measurement region 715 is positioned within the transfer chamber 713 so as to not interfere with the primary purpose of the transfer measurement module in moving workpieces through the process sequence and into and out of various processing modules. The measurement region defines one or more positions for placement of a workpiece for measurement. To that end, one or more inspection systems are configured to engage a workpiece that is positioned in the measurement region of the transfer chamber 713. The inspection system is then operable for measuring data associated with an attribute on the workpiece in accordance with the invention. As noted with the inspection systems disclosed herein, a support mechanism might be located within the measurement region 715 for supporting a workpiece during the collection of measurement data by the inspection system. Alternatively, the transfer mechanism 714 may provide the positioning and support of the workpiece within the measurement region 715 of the transfer chamber. In accordance with embodiments of the invention, the workpiece can be moved into or through the measurement region 715 during a processing sequence to obtain measurement data from one or more inspection systems that are associated with that measurement region. While a single measurement region is illustrated in FIG. 7C for illustrative purposes, multiple measurement regions 715 might be incorporated into the TMM 710'.

Referring to FIG. 7D, the TMM module 710' incorporates one or more inspection systems 730 located within a measurement region 715 and provides the ability to obtain real-time measurements and measurement data during a processing sequence. In one embodiment, measurement region 715 within the TMM 710' incorporates a support mechanism 738 that receives a workpiece from mechanism 714 for measurement inside chamber 713. Measurement data is captured as the workpiece is moved between processing modules. As discussed above, alternatively, the transfer mechanism or robot 714 might actually act as a support mechanism for moving the workpiece with respect to the inspection system 730 in the TMM 710'. Still further, the inspection system 730 in the TMM 710' might also incorporate a stationary workpiece wherein the inspection system 730 itself moves. Similarly, the inspection system 730 might be incorporated as part of or embedded with the support mechanism.

The measurement module or inspection system 730 may be entirely contained in the TMM 710' to make measurements. In other embodiments, a least a portion of the measurement module or inspection system is positioned inside of an internal space of the TMM 710' so as to define a measurement region within a dedicated area of the internal space as shown in FIG. 7D, while other portions may reside outside the TMM 710'. More specifically, measurement region 715 is defined and is located within a dedicated area of the internal space of the transfer chamber 713. The signal source and signal detector elements of inspection system 730 may be located externally of the transfer chamber internal space 713 while the workpiece support mechanism 738 and transfer mechanism 714 for supporting a workpiece 736 are contained within the transfer chamber 713. To that end, the inspection signals 734 pass through an appropriate access port 742 that is effectively transparent to the passage of the inspection signal 734 from the inspection system 730 and into the internal space 713 to engage workpiece 736 positioned in the measurement region 715. As noted, the inspection signal 734 might include an electromagnetic signal, an optical signal, a particle beam, a charged particle beam, or some combination of such signals. The access port 742 may be appropriately formed to operate with a specific inspection system and the sources of the inspection signal. For example, the access port 742 might include a window, an opening, a valve, a shutter, and iris, or some combination of different structures for forming the access port in order to allow incident inspection signals to engage the workpiece 736. To that end, at least a portion of the inspection system 730 might be located generally above a top surface of the transfer chamber 713.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method of selective deposition on a semiconductor workpiece using an integrated sequence of processing steps executed on a common manufacturing platform hosting a plurality of processing modules including one or more film-forming modules, one or more etching modules, and one or more transfer modules, the integrated sequence of processing steps including:
receiving a workpiece into the common manufacturing platform, the workpiece having a target surface of a first material and a non-target surface of a second material different than the first material;
depositing an additive material on the workpiece in one of the one or more film-forming modules, wherein the depositing is with selectivity relative to the non-target surface that results in a layer of the additive material forming on the target surface at a higher deposition rate than on the non-target surface;
transferring, by one of the one or more transfer modules after the depositing the additive material is completed, the workpiece from the one of the one or more film-forming modules to one of the one or more etching modules;
etching the workpiece in the one of the one or more etching modules to remove additive material from the non-target surface; and
repeating the depositing and etching until the layer of additive material reaches a target thickness,
wherein the integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment.

2. The method of claim 1, wherein the target surface and the non-target surface form a planar surface, and wherein depositing the additive material on the target surface forms an elevated feature above the planar surface.

3. The method of claim 1, wherein the target surface is an exposed bottom surface in a recessed feature formed in the second material, and wherein depositing the additive material on the target surface is a bottom-up deposition to at least partially fill the recessed feature, and wherein etching the workpiece includes removing the residue deposited as a contaminant on an upper planar surface of the second material adjacent to the recessed feature.

4. The method of claim 1, wherein the one or more film-forming modules include a vacuum environment, and the one or more transfer modules transfer the workpiece into and out of the one or more film-forming modules without breaking vacuum.

5. The method of claim 1, wherein the first material is a first metal, the second material is a dielectric material, and the additive material is a second metal.

6. The method of claim 5, wherein the integrated sequence of processing steps further comprises selectively forming a barrier layer on the non-target surface of dielectric material relative to the target surface of the first metal, such that more metal regions of the target surface are exposed than dielectric regions of the non-target surface, and depositing the additive material of the second metal on the workpiece increases an initial step-height between the metal regions of the target surface and the dielectric regions of the non-target surface based, at least in part, on the selective formation of the barrier layer.

7. The method of claim 1, further comprising:
obtaining measurement data related to one or more attributes of the workpiece in a workpiece measurement region located within a dedicated area of at least one of the one or more transfer modules or within a metrology module hosted on the common manufacturing platform, the measurement data being obtained after at least one of the processing steps of the integrated sequence of processing steps; and
when the measurement data indicates an attribute of the one or more attributes is non-conforming, performing a corrective action on the workpiece to remove, minimize, or compensate for the non-conforming attribute prior to performing a next processing step in the integrated sequence of processing steps.

8. The method of claim 7, wherein the integrated sequence of processing steps further comprises pre-treating the workpiece before depositing the layer of additive material by applying a self-assembled monolayer on the non-target surface to inhibit deposition of the additive material on the non-target surface, and wherein performing the corrective action comprises one or more of the following:
removing the self-assembled monolayer when the non-conforming attribute is based, at least in part, on incomplete coverage of the non-target surface by the self-assembled monolayer or an amount of exposed area of the non-target surface being greater than a predetermined exposed area threshold;
removing at least a portion of the layer of additive material when the non-conforming attribute is based, at least in part, on a step-height distance between the target surface and the non-target surface being less than a predetermined step-height threshold or an amount of exposed area of the non-target surface being less than the predetermined exposed area threshold;
adding further additive material to the workpiece when the non-conforming attribute is based, at least in part, on a thickness of the additive material overlying the target surface being less than a predetermined thickness threshold;
etching the workpiece when the non-conforming attribute is based, at least in part, on a remaining additive material on the non-target surface or a remaining self-assembled monolayer on the non-target surface being greater than a predetermined remaining thickness threshold; or
treating the workpiece when the non-conforming workpiece attribute is based, at least in part, on a reflectivity from the workpiece being less than a predetermined reflectivity threshold, wherein the treating is a temperature treatment, a plasma etch treatment, or combination thereof.

9. The method of claim 7, wherein the integrated sequence of processing steps further comprises, prior to depositing the additive material, etching the target surface to remove surface contamination, and selectively forming a barrier layer on the non-target surface relative to the target surface, such that more regions of the target surface are exposed than regions of the non-target surface, and wherein performing the corrective action comprises one or more of the following:

- removing the barrier layer when the non-conforming attribute is based, at least in part, on incomplete coverage of the regions of the non-target surface by the barrier layer or an amount of exposed area of the non-target surface is greater than a predetermined exposed area threshold;
- removing at least a portion of the layer of additive material when the non-conforming attribute is based, at least in part, on a step-height distance between the target surface and the non-target surface being less than a predetermined step-height threshold or an amount of exposed area of the non-target surface being less than the predetermined exposed area threshold;
- adding further additive material to the workpiece when the non-conforming attribute is based, at least in part, on a thickness of the additive material overlying the target surface being less than a predetermined thickness threshold;
- etching the workpiece when the non-conforming attribute is based, at least in part, on a remaining additive material on the non-target surface or a remaining barrier layer on the non-target surface being greater than a predetermined remaining thickness threshold; or
- treating the workpiece when the non-conforming workpiece attribute is based, at least in part, on a reflectivity from the workpiece being less than a predetermined reflectivity threshold, wherein the treating is a temperature treatment, a plasma etch treatment, or combination thereof.

10. The method of claim 1, wherein the integrated sequence of processing steps further comprises pre-treating the workpiece before depositing the layer of additive material to alter a surface termination of the target surface, or a surface termination of the non-target surface, or a combination thereof, and wherein the plurality of processing modules hosted on the common manufacturing platform includes one or more pre-treatment modules for performing the pre-treating in the controlled environment.

11. The method of claim 10, wherein the pre-treating includes applying a self-assembled monolayer on the non-target surface to inhibit deposition of the additive material on the non-target surface and to provide the selectivity on the target surface relative to the non-target surface.

12. The method of claim 11, wherein the etching includes removing the self-assembled monolayer.

13. The method of claim 11, wherein the first material is a first dielectric material, the second material is a metal, and the additive material is a second dielectric material.

14. The method of claim 11, wherein the first material is a metal, the second material is a first dielectric material, and the additive material is a second dielectric material, or wherein the first material is a dielectric material, the second material is a first metal, and the additive material is a second metal.

15. The method of claim 1, further comprising:

within the controlled environment, obtaining measurement data related to one or more attributes of the workpiece and, based on the measurement data, determining whether a defect, thickness, uniformity, and/or selectivity of the additive material on the workpiece meets a target condition.

16. The method of claim 15, wherein the plurality of processing modules includes a correction module, the method further comprising:

when the defect, thickness, uniformity, and/or selectivity of the additive material on the workpiece is determined to not meet the target condition, processing the workpiece in the correction module to remove at least a portion of the additive material from at least one of the target surface or the non-target surface.

17. The method of claim 15, wherein the one or more transfer modules further include a workpiece measurement region located within a dedicated area of at least one of the one or more transfer modules, and wherein the obtaining measurement data is performed during at least one of the transfers of the workpiece between the plurality of processing modules by passing the workpiece into the workpiece measurement region.

18. The method of claim 15, wherein the common manufacturing platform includes one or more metrology modules, and wherein the obtaining measurement data is performed by transferring the workpiece into the metrology module between one or more of the processing steps of the integrated sequence of processing steps.

19. The method of claim 15, wherein the one or more attributes include attributes of the target surface prior to depositing the additive material, attributes of the non-target surface prior to depositing the additive material, attributes of the layer of additive material after depositing the additive material, attributes of the non-target surface after depositing the additive material, attributes of the layer of additive material after etching the workpiece, or attributes of the non-target surface after etching the workpiece.

20. The method of claim 19, wherein the one or more attributes include an amount of voids on the target surface, an amount of additive material on the non-target surface, a loss of selectivity, a profile of the additive material, an amount of the additive material on one region of the workpiece relative to an amount of the additive material on another region of the workpiece, or a combination of two or more thereof.

* * * * *